United States Patent
Chen et al.

(10) Patent No.: US 8,076,699 B2
(45) Date of Patent: Dec. 13, 2011

(54) INTEGRATED HEMT AND LATERAL FIELD-EFFECT RECTIFIER COMBINATIONS, METHODS, AND SYSTEMS

(75) Inventors: Jing Chen, Hong Kong (CN); Wanjun Chen, Hong Kong (CN); Chunhua Zhou, Hong Kong (CN)

(73) Assignee: The Hong Kong Univ. of Science and Technology, Hong Kong (CN)

( * ) Notice: Subject to any disclaimer, the term of this patent is extended or adjusted under 35 U.S.C. 154(b) by 180 days.

(21) Appl. No.: 12/414,865

(22) Filed: Mar. 31, 2009

(65) Prior Publication Data
US 2010/0019279 A1 Jan. 28, 2010

Related U.S. Application Data

(60) Provisional application No. 61/064,899, filed on Apr. 2, 2008.

(51) Int. Cl.
*H01L 29/778* (2006.01)
*H01L 21/335* (2006.01)

(52) U.S. Cl. ......... 257/194; 257/E21.246; 257/E21.403; 438/172

(58) Field of Classification Search .............. 257/194
See application file for complete search history.

(56) References Cited

U.S. PATENT DOCUMENTS

| | | | |
|---|---|---|---|
| 3,767,984 A | 10/1973 | Sinoda et al. | |
| 4,095,331 A | 6/1978 | Rutz | |
| 4,157,556 A | 6/1979 | Decker et al. | |
| 4,710,787 A | 12/1987 | Usagawa et al. | |
| 5,571,734 A | 11/1996 | Tseng et al. | |
| 5,825,079 A | 10/1998 | Metzler et al. | |
| 5,907,777 A | 5/1999 | Joseph et al. | |
| 6,093,952 A | 7/2000 | Bandic et al. | |
| 6,133,593 A | 10/2000 | Boos et al. | |
| 6,166,404 A | 12/2000 | Imoto et al. | |
| 6,316,793 B1 | 11/2001 | Sheppard et al. | |
| 6,458,675 B1 | 10/2002 | Marukawa | |
| 6,603,179 B2 | 8/2003 | Ando et al. | |

(Continued)

FOREIGN PATENT DOCUMENTS

JP 11121737 A 4/1999

(Continued)

OTHER PUBLICATIONS

Khan et al., "Insulating gate III-N heterostructure field-effect transistors for high-power microwave and switching applications," IEEE Trans. Microw. Theory Tech., vol. 51, No. 2, pp. 624-633, Feb. 2003.

(Continued)

*Primary Examiner* — N Drew Richards
*Assistant Examiner* — Robert Carpenter
(74) *Attorney, Agent, or Firm* — Turocy & Watson, LLP

(57) ABSTRACT

Integrated high efficiency lateral field effect rectifier and HEMT devices of GaN or analogous semiconductor material, methods for manufacturing thereof, and systems which include such integrated devices. The lateral field effect rectifier has an anode containing a shorted ohmic contact and a Schottky contact, and a cathode containing an ohmic contact, while the HEMT preferably has a gate containing a Schottky contact. Two fluorine ion containing regions are formed directly underneath both Schottky contacts in the rectifier and in the HEMT, pinching off the (electron gas) channels in both structures at the hetero-interface between the epitaxial layers.

17 Claims, 23 Drawing Sheets

U.S. PATENT DOCUMENTS

| | | | |
|---|---|---|---|
| 6,690,042 | B2 | 2/2004 | Khan et al. |
| 6,773,999 | B2 | 8/2004 | Yoneda |
| 6,797,555 | B1 | 9/2004 | Hopper et al. |
| 6,825,133 | B2 | 11/2004 | Yu et al. |
| 7,052,942 | B1 | 5/2006 | Smart et al. |
| 7,126,426 | B2 | 10/2006 | Mishra et al. |
| 7,262,446 | B2 | 8/2007 | Toyama |
| 7,312,472 | B2 | 12/2007 | Chiyo et al. |
| 7,339,209 | B2 | 3/2008 | Brar |
| 7,375,407 | B2 | 5/2008 | Yanagihara et al. |
| 7,382,001 | B2 | 6/2008 | Beach |
| 7,402,492 | B2 | 7/2008 | Jeon et al. |
| 2001/0015437 | A1 | 8/2001 | Ishii et al. |
| 2001/0034116 | A1 | 10/2001 | Lee et al. |
| 2002/0177261 | A1 | 11/2002 | Song et al. |
| 2003/0020092 | A1 | 1/2003 | Parikh et al. |
| 2003/0205721 | A1 | 11/2003 | Nishii et al. |
| 2003/0218183 | A1 | 11/2003 | Micovic et al. |
| 2004/0041169 | A1 | 3/2004 | Ren et al. |
| 2004/0135161 | A1 | 7/2004 | Taylor |
| 2005/0007200 | A1 | 1/2005 | Inoue et al. |
| 2005/0059197 | A1 | 3/2005 | Yamashita et al. |
| 2005/0062069 | A1 | 3/2005 | Saito et al. |
| 2005/0110054 | A1 | 5/2005 | Wohlmuth |
| 2005/0189561 | A1* | 9/2005 | Kinzer et al. ............... 257/192 |
| 2005/0277255 | A1 | 12/2005 | Asano |
| 2006/0060871 | A1 | 3/2006 | Beach |
| 2006/0108606 | A1 | 5/2006 | Saxler et al. |
| 2006/0121658 | A1 | 6/2006 | Ahn et al. |
| 2006/0175633 | A1* | 8/2006 | Kinzer ............... 257/192 |
| 2007/0108547 | A1 | 5/2007 | Zhu et al. |
| 2007/0114569 | A1 | 5/2007 | Wu et al. |
| 2007/0224710 | A1 | 9/2007 | Palacios et al. |
| 2007/0228416 | A1 | 10/2007 | Chen et al. |
| 2007/0278518 | A1 | 12/2007 | Chen et al. |
| 2007/0295993 | A1 | 12/2007 | Chen et al. |
| 2008/0116492 | A1 | 5/2008 | Wu et al. |
| 2008/0128752 | A1 | 6/2008 | Wu |
| 2008/0191216 | A1* | 8/2008 | Machida et al. ............... 257/76 |
| 2009/0032820 | A1 | 2/2009 | Chen |

FOREIGN PATENT DOCUMENTS

JP        2004-031896        1/2004

OTHER PUBLICATIONS

Khan et al., "Enhancement and depletion mode GaN/AlGaN heterostructure field effect transistors," Appl. Phys. Lett., vol. 68, No. 4, pp. 514-516, Jan. 1996.

Khan et al., "AlGaN/GaN metal oxide semiconductor heterostructure field effect transistor," IEEE Electron Device Lett., vol. 21, No. 2, pp. 63-65, Feb. 2000.

Kim et al., "Gate current leakage and breakdown mechanism in unpassivated AlGaN/GaN high electron mobility transistors by post-gate annealing", Appl. Phys. Lett. vol. 86, 143505, Mar. 2005.

Koudymov et al., "Maximum current in nitride-based heterostructure field-effect transistors," Appl. Phys. Lett., vol. 80, No. 17, pp. 3216-3218, Apr. 2002.

Kumar et al., "AlGaN/GaN HEMTs on SiC with fT of over 120 GHz," IEEE Electron Device Lett. vol. 23, No. 8, pp. 455-457, Aug. 2002.

Kumar et al., "High transconductance enhancement-mode AlGaN/GaN HEMTs on SiC substrate," Electron. Lett., vol. 39, No. 24, pp. 1758-1760, Nov. 2003.

Lanford, et al., "Recessed-gate enhancement-mode GaN HEMT with high threshold Voltage," Electron. Lett., vol. 41, No. 7, pp. 449-450, Mar. 2005.

Lee et al., "High Breakdown Voltage GaN Schottky Barrier Diode employing Floating Metal Rings on AlGaN/GaN Hetero-junction," Proceedings of the 17 International Symposium on Power Semiconductor Devices & IC's May 23-26, 2005 Santa Barbara, CA.

Limb et al., "Low on-resistance GaN pin rectifiers grown on 6H-SiC substrates," Electronics Letters vol. 43 No. 6, Mar. 2007.

Liu et al., "AlGaN/GaN/InGaN/GaN Double Heterojunction HEMTs with an InGaN-Notch for Enhanced Carrier Confinement," IEEE Electron Device Lett. vol. 27, No. 1, pp. 10-12, Jan. 2006.

Liu et al., "DC and RF Characteristics of AlGaN/GaN/InGaN/GaN Double-Heterojunction HEMTs," IEEE Trans. Electron Devices, vol. 54, No. 1, pp. 2-10, Jan. 2007.

Mahajan et al."Fabrication and characterization of an InAlAs/InGaAs/InP ring oscillator using integrated enhancement- and depletion-mode high-electron mobility transistors," IEEE Electron Device Lett., vol. 18, No. 8, pp. 391-393, Aug. 1997.

Meneghesso et al., "Current Collapse and High-Electric-Field Reliability of Unpassivated GaN/AlGaN/GaN HEMTs," IEEE Electron Device Lett., vol. 53, No. 12, pp. 2932-2941, Dec. 2006.

Menozzi, Roberto, "Off-State Breakdown of GaAs PHEMTs: Review and New Data", IEEE Trans. Electron Devices vol. 4, No. 1, pp. 54-62, Mar. 2004.

Micovic et al., "GaN double heterojunction field effect transistor for microwave and millimeterwave power applications," in IEDM Tech. Dig. 2004, pp. 807-810.

Micovic et al., "GaN enhancement/depletion-mode FET logic for mixed signal applications," Electron. Lett., vol. 41, No. 19, pp. 1081-1083, Sep. 2005.

Mikkelson et al., "High-density GaAs integrated circuit manufacturing," IEEE Trans. Semicond. Manuf., vol. 16, No. 3, pp. 384-389, Aug. 2003.

Miller et al., "Gate leakage current mechanisms in AlGaN/GaN heterostructure field-effect transistors," J. Appl. Phys., vol. 88, No. 10, pp. 5951-5953, Nov. 2000.

Moon et al., "Submicron Enhancement-Mode AlGaN/GaN HEMTs," Jun. 2002, Digest of 60th Device Research Conference, pp. 23-44.

Nakao et al., "Study on off-state breakdown in AlGaN/GaN HEMTs," Phys. Stat. Sol. (c) vol. 0, No. 7, pp. 2335-2338, Dec. 2003.

Neudeck et al., "High-temperature electronics—A role for wide bandgap semiconductors?," Proc. IEEE, vol. 90, No. 6, pp. 1065-1076, Jun. 2002.

Nowakowski, "Choosing the Optimum Switching Frequemncy for DC-DC Converters," EE Times-India, Oct. 2006.

Ohno et al., "Effects of surface passivation on breakdown of AlGaN/GaN high-electron-mobility transistors," Appl. Phys. Lett. vol. 84, No. 12, pp. 2184-2186, Mar. 2004.

Omura et al. "Gallium Nitride Power HEMT for High Switching Frequency Power Electronics," IEEE pub. No. 978-14244-17285 (2007).

Palacios et al., "AlGaN/GaN high electron mobility transistors with InGaN back-barriers," IEEE Electron Device Lett., vol. 27, No. 1, pp. 13-15, Jan. 2006.

Palacios et al., "High-performance E-mode AlGaN/GaN HEMTs," IEEE Electron Device Lett., vol. 27, No. 6, pp. 428-430, Jun. 2006.

Cai et al., Published conference abstract of submission on Jan. 27, 2005 to the 4ih Electronics Material Conference, which was held on Jun. 22-24, 2005 in Santa Barbara, California, entitled "Threshold Voltage Control of AlGaN/GaN HEMTs by CF4 Plasma Treatment."

Rumyantsev et al., "Effect of gate leakage current on noise properties of AlGaN/GaN field effect transistors," J. Appl. Phys., vol. 88, No. 11, pp. 6726-6730, Dec. 2000.

Saito et al., "Recessed-Gate Structure Approach Toward Normally Off High-Voltage AlGaN/GaN HEMT for Power Electronics Applications," 53 IEEE Transactions of Electron Devices 356-362, Feb. 2006.

Saito et al., "High breakdown voltage AlGaN-GaN power-HEMT design and high current density switching behavior," IEEE Trans. Electron Devices, vol. 50, No. 12, pp. 2528-2531, Dec. 2003.

Sierakowski et al., "Analysis of Schottky gate electron tunneling in polarization induced AlGaN/GaN high electron mobility transistors," J. Appl. Phys., vol. 86, No. 6, pp. 3398-3401, Sep. 1999.

Song et al., "Normally Off AlGaN/GaN Low-Density Drain HEMT (LDD-HEMT) With Enhanced Breakdown Voltage and Reduced Current Collapse". IEEE Electron Device Lett., vol. 28, No. 3, pp. 189-191, 2007.

Takatani et al., "AlGaN/GaN Schottky-ohmic combined anode field effect diode with fluoride-based plasma treatment," Electronics Letters vol. 44 No. 4, Feb. 2008.

Tan et al., "Gate leakage effect and breakdown voltage in metalorganic vapor phase epitaxy AlGaN/GaN heterostructure field-effect transistors", Appl. Phys. Lett. vol. 80, No. 17, pp. 3207-3209, Apr. 2002.

Tanimoto et al., "Single-Voltage-Supply Highly Efficient E/D Dual-Gate Pseudomorphic Double-Hetero HEMT's with Platinum Buried Gates" IEEE Electron Device Lett., vol. 45, No. 6, pp. 1176-1182, Jun. 1998.

Tipirneni et al., "The 1.6-kV AlGaN/GaN HFETs" IEEE Electron Device Lett., vol. 27, pp. 716-718, 2006.

Uemoto et al., "8300V Blocking Voltage AlGaN/GaN Power HFET with Thick Poly-AlN Passivation," IEDM'07, pp. 861-864, 2007.

Uren et al., "Punchthrough in short-channel AlGaN/GaN HFETs," IEEE Trans. Electron Devices, vol. 53, No. 2, pp. 395-398, Feb. 2006.

Vetury et al., "Performance and RF Reliability of GaN-on-SiC HEMT's using Dual-Gate Architectures" pp. 714-717, 2006.

Wang et al., "Source Injection Induced Off-State Breakdown and Its Improvement by Enhanced Back Barrier with Fluorine Ion Implantation in AlGaN/GaN HEMTs," IEDM'08, pp. 149-152, 2008.

Wang et al., "Enhancement Mode $Si_3N_4$/AlGaN/GaN MISHFETs," IEEE Electron Device Letters, vol. 27, No. 10, pp. 793-795, 2006.

Wang et al., "Planar Integration of E/D-Mode AlGaN/GaN HEMTs Using Fluoride-Based Plasma Treatment," IEEE Electron Device Letters, vol. 27, No. 8, pp. 633-635, Aug. 2006.

Webb et al., "Semi-insulating C-doped GaN and high-mobility AlGaN/GaN heterostructures grown by ammonia molecular beam epitaxy," Appl. Phys. Lett. vol. 75, No. 7, pp. 953-955, Aug. 1999.

Wu et al., "High-gain Microwave GaN HEMTs with Source-terminated Field-plates" IEDM 2004, pp. 1078-1079.

Wu et al., "30-W/mm GaN HEMT by field plate optimization," IEEE Electron Device Lett. vol. 25, No. 3, pp. 117-119, Mar. 2004.

Xing et al., "High breakdown voltage AlGaN-GaN HEMTs achieved by multiple field plates," IEEE Electron Device Lett., vol. 25, No. 4, pp. 161-163, Apr. 2004.

Yoshida et al., "Low On-Voltage Operation AlGaN/GaN Schottky Barrier Diode with a Dual Schottky Structure," IEICE Trans. Electron., vol. E88-C, No. 4, pp. 690-693, Apr. 2005.

Zhang et al., "Vertical and lateral GaN rectifiers on free-standing GaN substrates," Applied Physics Letters vol. 79, No. 10, pp. 1555-1557, Sep. 2001.

Zhang et al., "Comparison of GaN P-I-N and Schottky Rectifier Performance," IEEE Transactions on Electron Devices, vol. 48, No. 3, pp. 407-501, Mar. 2001.

Zhang et al., "Kilovolt AlGaN/GaN HEMTs as Switching Devices," phys. stat. sol. (a) 188, No. 1, 213-217 (2001).

Zhou et al., "High breakdown voltage Schottky rectifier fabricated on bulk n-GaN substrate," Solid-State Electronics 50 (2006) 1744-1747.

Ziegler, James, "Instruction Manual: The Stopping and Range of Ions in Matter," Dec. 22, 1995.

Final Office Action dated Dec. 24, 2009, issued in U.S. Appl. No. 11/564,780.

Non-Final Office Action dated Jan. 5, 2009, issued in U.S. Appl. No. 11/564,780.

Non-Final Office Action dated Jun. 29, 2009, issued in U.S. Appl. No. 11/564,780.

Final Office Action dated Dec. 12, 2008, issued in U.S. Appl. No. 11/564,795.

Non-Final Office Action dated Dec. 10, 2009, issued in U.S. Appl. No. 11/564,795.

Non-Final Office Action dated May 13, 2008, issued in U.S. Appl. No. 11/564,795.

Non-Final Office Action dated Jun. 10, 2009, issued in U.S. Appl. No. 11/564,795.

Non-Final Office Action dated Oct. 30, 2008, issued in U.S. Appl. No. 11/564,766.

Email from Dr. Cai to Dr. Chen dated Oct. 29, 2004 and attachment report.

Lab notes between Mar. 29-Oct. 30, 2004 of Dr. Yong Cai, one of the inventors.

Neuberger et al., "Observation of ion-induced changes in the channel current of high electron mobility AlGaN/GaN transistors (HEMT)", 2002, Elsevier-Materials Science and Engineering, pp. 143-146.

Non-Final Office Action dated Jan. 8, 2010, issued in U.S. Appl. No. 11/564,766.

Final Office Action dated Apr. 29, 2009, issued in U.S. Appl. No. 11/564,766.

Okamoto et al., "Improved Power Performance for a Recessed-Gate AlGaN-GaN Heterojunction FET With a Field-Modulating Plate," IEEE Transactions on Microwave Theory and Techniques, vol. 52, No. 11, Nov. 2004, pp. 2536-2540.

Liu et al., "Highly Linear $Al_{0.3}Ga_{0.7}N$-$Al_{0.05}Ga_{0.95}N$-GaN Composite-Channel HEMTs," IEEE Electron Device Letters, vol. 26, No. 3, Mar. 2005, pp. 145-147.

Ambacher et al., ""Two-dimensional electron gases induced by spontaneous and piezoelectric polarization charges in N-and Ga-face AlGaN/GaN heterostructures."" J. Appl. Phys., vol. 85, No. 6, pp. 3222-3233, Mar. 1999.

Ando et al., "10-W/mm AlGaN-GaN HFET With a Field Modulating Plate," IEEE Electron Device Letters, vol. 24, No. 5, 289-291, May 2003.

Ando et al., "Novel AlGaN/GaN Dual-Field-Plate FET With High Gain, Increased Linearity and Stability," IEDM 2005, pp. 576-579, 2005.

Anwar et al. "Carrier trapping and current collapse mechanism in GaN metal-semiconductor field-effect transistors," Appl. Phys. Lett. vol. 84, No. 11, pp. 1970-1972, Mar. 2004.

Ao et al., "Copper gate AlGaN/GaN HEMT with low gate leakage current," IEEE Electron Device Lett., vol. 24, No. 8, pp. 500-502, Aug. 2003.

Arulkumaran et al., "Surface passivation effects on GaN high-electron-mobility transistors with $SiO_2$, $Si_3N_4$, and silicon oxynitride," J. Appl. Phys., vol. 84, No. 4, pp. 613-615, Jan. 2004.

Bahat-Treidel et al., "Punchthrough-Voltage Enhancement of AlGaN/GaN HEMTs Using AlGaN Double-Heterojunction Confinement", IEEE Trans. Electron Devices vol. 55, No. 12, pp. 3354-3359, Dec. 2008.

Bahl et al., "A New Drain—Current Injection Technique for the Measurement of Off-State Breakdown Voltage in FET's," IEEE Trans. Electron Devices, vol. 40, No. 8, pp. 1558-1560, Aug. 1993.

Bandic et al., "High voltage (450 V) GaN Schottky rectifiers," Applied Physics Letters vol. 74, No. 9, pp. 1266-1268, Mar. 1999.

Ben-Yaacov et al., "AlGaN/GaN current aperture vertical electron transistors with regrown channels,"J. Appl. Phys., vol. 95, No. 4, pp. 2073-2078, Feb. 2004.

Bern et al., "Effect of surface passivation on performance of AlGaN/GaN/Si HEMTs," Solid State Electron., vol. 47, No. 11, pp. 2097-2103, Nov. 2003.

Boguslawski et al., "Native Defects in Gallium Nitride". Phys. Rev. B, vol. 51, No. 23, pp. 17255-17259, Jun. 1995.

Cai et al., "Control of Threshold Voltage of AlGaN/GaN HEMTs by Fluoride-Based Plasma Treatment: From Depletion to Enhancement Mode," IEEE Electron Device Letters, vol. 53, No. 9, pp. 2207-2215, 2006.

Cai et al., "III-nitride metal-insulator-semiconductor heterojunction field-effect transistor," Appl. Phys. Lett., vol. 86, No. 3, p. 032109, Jan. 2005.

Cai et al., "High-Performance Enhancement-Mode AlGaN/GaN HEMTs Using Fluoride-Based Plasma Treatment," IEEE Electron Device Lett. vol. 26, No. 7, pp. 435-437, Jul. 2005.

Cai et al., "Monolithically Integrated Enhancement/Depletion-Mode AlGaN/GaN HEMT Inverters and Ring Oscillators Using CF4 Plasma Treatment," IEEE Trans. Electron Devices, vol. 53, No. 9, pp. 2223-2230, Sep. 2006.

Cai et al., "Monolithic integration of enhancement- and depletion-mode AlGaN/GaN HEMTs for GaN digital integrated circuits," in IEDM Tech. Dig., Dec. 2005, pp. 771-774.

Cai et al., "High-Temperature Operation of AlGaN/GaN HEMTs Direct-Coupled FET Logic (DCFL) Integrated Circuits," IEEE Electron Device Lett. vol. 28, No. 5, pp. 328-331, May 2007.

Chen et al., "High-Performance InP-based Enhancement-Mode HEMTs Using Non-Alloyed Ohmic Contacts and Pt-based Buried-Gate Technologies," Feb. 1996, IEEE Trans. on Electron Devices, vol. 43, No. 2, pp. 252-257.

Chen et al., "AlGaN/GaN dual-gate modulation-doped field-effect transistors" IEEE Electronics Letters vol. 35, No. 11, pp. 933-934, May 1999.

Chen et al., "Dual-Gate AlGaN/GaN Modulation-Doped Field-Effect Transistors with Cut-Off Frequencies fT > 60 GHz," IEEE Electron Device Lett., vol. 21, No. 12, pp. 549-551, Dec. 2000.

Chini et al., "Power and linearity characteristics of GaN MISFET on sapphire substrate," IEEE Electron Device Lett., vol. 25, No. 2, pp. 55-57, Feb. 2004.

Chow et al., "Wide band gap compound semiconductors for superior high-voltage unipolar power devices," IEEE Trans. Electron Devices, vol. 41, No. 8, pp. 1481-1483, Aug. 1994.

Chu, "Recent developments and applications of plasma immersion ion implantation," J. Vac. Sci. Technol. B, vol. 22, No. 1, pp. 289-296, Jan./Feb. 2004.

Dang et al., "Fabrication and characterization of enhanced barrier AlGaN/GaN HFET", Electron. Lett. vol. 35, No. 7, pp. 602-603, 1999.

Daumiller et al., "Evaluation of the temperature stability of AlGaN/GaN heterostructure FET's," IEEE Electron Device Lett., vol. 20, No. 9, pp. 448-450, Sep. 1999.

Di Forte-Poisson et al., "Relationship between physical properties and gas purification in GaN grown by metalorganic vapor phase epitaxy," J. Cryst. Growth, vol. 195, No. 1-4 pp. 314-318, Dec. 1998.

Dora et al., "High breakdown voltage achieved on AlGaN/GaN HEMTs with integrated slant field plates," IEEE Electron Device Lett., vol. 27, No. 9, pp. 713-715, Sep. 2006.

Cai et al. "Self-aligned Enhancement Mode AlGan/GaN HEMTs Using Fluoride-based Plasma Treatment" 2005 IEEE, pp. 179-180.

Dyakonova et al., "Temperature dependence of impact ionization in AlGaN-GaN heterostructures field effect transistors," Appl. Phys. Lett. vol. 72, No. 20, pp. 2562-2564, May 1998.

Eden et al., "Planar GaAs IC Technology: Applications for digital LSI," IEEE J. Solid-State Circuits, vol. 13, No. 4, pp. 419-426, Aug. 1978.

Egawa et al., "Characterizations of recessed gate AlGaN/GaN HEMTs on sapphire," IEEE Trans. Electron Devices, vol. 48, No. 3, pp. 603-608, Mar. 2003.

Endoh et al., "Non-recessed-gate enhancement-mode AlGaN/GaN high electron mobility transistors with high RF performance," Jpn. J. Appl. Phys., vol. 43, No. 4B, pp. 2255-2258, 2004.

Hashizume et al., "Leakage mechanism in GaN and AlGaN Schottky interfaces," Appl. Phys. Lett., vol. 84, No. 24, pp. 4884-4886, Jun. 2004.

Hashizume et al., "Suppression of current collapse in insulated gate AlGaN/GaN heterostructure field-effect transistors using ultrathin Al.sub.2O.sub.3 dielectric," Appl. Phys. Lett., vol. 83, No. 14, pp. 2952-2954, Oct. 2003.

Heikman et al., "Growth of Fe doped semi-insulating GaN by metalorganic chemical vapor deposition," Appl. Phys. Lett. vol. 81, No. 3, pp. 439-441, Jul. 2002.

Horio et al., "Physics-based simulation of buffer-trapping effects on slow current transients and current collabpse in GaN field effect transistors," J. Appl. Phys., vol. 98, pp. 124502-1-124502-7, Dec. 2005.

Hu et al., "Si.sub.3N.sub.4 /AlGaN/GaN-metal-insulator-semiconductor heterostructure field-effect transistors," Appl. Phys. Lett., vol. 79, No. 17, pp. 2832-2834, Oct. 2001.

Hu et al., "Enhancement mode AlGaN/GaN HFET with selectively grown pn junction gate," Electron. Lett., vol. 36, No. 8, pp. 753-754, 2000.

Hussain, et al., "GaN HFET digital circuit technology for harsh environments," Electron. Lett., vol. 39, No. 24, pp. 1708-1709. Nov. 2003.

Irokawa et al., "Current-voltage and reverse recovery characteristics of bulk GaN p-i-n rectifiers," Applied Physics Letters, vol. 83, No. 11, pp. 2271-2273, Sep. 2003.

Jia et al., "Enhancement-mode AlGaN/GaN HEMTs on silicon substrate" phys. stat. sol. (c) 3, No. 6, 2368-2372 (2006).

Joh et al., "Mechanisms for Electrical Degradation of GaN High-Electron Mobility Transistors," Electron Devices Meeting, 2006. IEDM '06. International Volume, Dec. 11-13, 2006.

Johnson et al., "Breakdown Voltage and Reverse Recovery Characteristics of Free-Standing GaN Schottky Rectifiers," IEEE Transactions on Electron Devices, vol. 49, No. 1, pp. 32-36, Jan. 2002.

Johnson et al., "12 W/mm AlGaN/GaN HFETs on siicon substrates," IEEE Electron Device Lett., vol. 25, No. 7, pp. 459-461, Jul. 2004.

Kanamura et al., "An over 100 W n-GaN/n-AlGaN/GaN MIS-HEMT power amplifier for wireless base station applications," in IEDM Tech. Dig., Dec. 2005, pp. 572-575.

Kanechika et al., "A vertical insulated gate AlGaN/GaN heterojunction field-effect transistor," Jpn. J. Appl. Phys., vol. 46, No. 21, pp. L503-L505, May 2007.

Karmalkar et al., "Enhancement of Breakdown Voltage in AlGaN/GaN High Electron Mobility Transistors Using a Field Plate," IEEE Trans. Electron Devices, vol. 48, No. 8, pp. 1515-1521, Aug. 2001.

Karmalkar et al., "Mechanism of the reverse gate leakage in AlGaN/GaN high electron mobility transistors," Appl. Phys. Lett., vol. 82, No. 22, pp. 3976-3978, Jun. 2000.

Ketterson et al., "GaAs/AlGaAs and InGaAs/AlGaAs MODFET inverter simulations," IEEE Trans. Electron Devices, vol. ED-33, No. 11, pp. 1626-1634, 1986.

Office Action dated Jun. 24, 2010 for U.S. Appl. No. 11/564,795, 72 pages.

Office Action dated Jul. 9, 2010 for U.S. Appl. No. 11/564,766, 64 pages.

Notice of Allowance mailed Mar. 4, 2011 for U.S. Appl. No. 11/564,780, 36 pages.

Office Action dated Apr. 15, 2011 for U.S. Appl. No. 12/185,241, 36 pages.

Office Action dated Jul. 14, 2011 for U.S. Appl. No. 12/558,242, 53 pages.

Office Action dated Oct. 12, 2011 for U.S. Appl. No. 12/185,241, 13 pages.

Office Action dated Nov. 3, 2011 for U.S. Appl. No. 12/558,242, 18 pages.

* cited by examiner

INTEGRATED HEMT AND LATERAL FIELD-EFFECT RECTIFIER COMBINATIONS, METHODS, AND SYSTEMS

CROSS-REFERENCE

Priority is claimed from the U.S. Provisional Patent Application No. 61/064,899, filed on Apr. 2, 2008, which is hereby incorporated by reference.

BACKGROUND

The present application relates to III-N-type power devices, methods, and systems, and more particularly to III-N-type integrated power devices having heterostructure transistors and lateral field-effect rectifiers on the same chip, and to related manufacturing methods, operating methods, and systems.

Note that the points discussed below may reflect the hindsight gained from the disclosed inventions, and are not necessarily admitted to be prior art.

Power semiconductor devices include two categories: 1) three-terminal transistors as switches and 2) two-terminal rectifiers. Both rectifiers and transistors are essential components in high voltage power electronics applications, for example, switching-mode power supplies and many forms of drive circuits.

For transistors, AlGaN/GaN high electron mobility transistors (HEMTs) are often the best choice. Group III-nitride ("III-N") compound semiconductors, such as those incorporating AlGaN/GaN, possess the advantages of having wide bandgap, high breakdown field, and large thermal conductivity, which can bring significant benefits to the design of heterostructure field-effect transistors and applications. The wide-bandgap AlGaN/GaN heterostructure system, enhanced by the spontaneous and piezoelectric polarization effects, yields two-dimensional electron gas (2DEG) channel with a high sheet charge concentration and high electron mobility. HEMT transistor structures hence generate record output power densities at microwave frequencies.

AlGaN/GaN heterostructures for power electronics application can operate at higher temperature and higher switching frequency than other device types. For a given breakdown voltage (BV) requirement, the GaN semiconductors may present an on-resistance ($R_{on}$) that is three orders of magnitude lower than Si semiconductors.

For rectifiers, two-terminal power rectifiers with low forward turn-on voltage ($V_{F,ON}$), low specific on-resistance ($R_{ON, sp}$) and high reverse breakdown voltage (BV) are desirable in high-voltage power electronics, e.g. in switching-mode power supplies and power factor correction circuits. Low on-state resistance and short reverse recovery time, for a given off-state breakdown voltage, are important for power conversion efficiency.

Various efforts have been made to improve power rectifier performance. Some proposed structures include JBS (junction barrier Schottky) diode, MPS (merged p-i-n Schottky) diode, and synchronous rectifier. Another is Schottky barrier diodes (SBDs, FIG. 1) and p-i-n diodes on doped bulk GaN, which presents high-breakdown low-on-resistance features.

However, since the epitaxial structures for SBD or p-i-n diodes are not compatible with the HEMT structures, the SBD or p-i-n diode rectifiers have not been successfully integrated with HEMTs (at least not without unacceptable performance loss). Although SBDs can be directly formed on AlGaN/GaN heterostructures, the series combination of the AlGaN/GaN heterojunction with the metal-AlGaN Schottky barrier results in higher turn-on voltages and higher on-resistances.

A recently developed dual-metal SBD system (FIG. 2) combines a low Schottky barrier metal (Al/Ti) and a high Schottky barrier metal (Pt) to provide an anode with a low turn-on voltage. However, this too presents some incompatibility with AlGaN/GaN HEMTs, since the HEMTs conventionally use Ni/Au gate metallization. Thus additional processing steps will be required.

SUMMARY

The present application discloses new structures and methods in which merged rectifiers (e.g. Schottky plus field-effect diodes) are integrated with HEMT-type transistors, in III-N semiconductor material or the like. This allows high performance rectifiers and transistors to be manufactured on the same chip in one process. The present application also discloses various systems which advantageously incorporate such structures and/or methods.

In various embodiments, the various disclosed integrated structures will produce electronic devices capable of operation at high power levels, high temperatures, and in noisy environments. This is particularly advantageous e.g. for compact and/or high-efficiency power converters, for motor drive circuits, for audio amplifiers, for local interface to combustion engines, for various aerospace applications, and for downhole electronics in oil and gas wells.

In one advantageous class of embodiments, the integrated structure provides both a merged power rectifier, with low turn-on voltage, low on-resistance, high breakdown voltage and high switching speed, and also a normally-off AlGaN/GaN heterostructure transistor, in a combination which uses the same epitaxial wafers as well as the same fabricating process.

In one preferred embodiment, the rectifier incorporates negatively charged fluorine ions under the Schottky contact by Fluorine plasma ion implantation (or treatment) technique, which effectively depletes the 2DEG under the Schottky contact region and pinches off the conduction path. By electrically shorting the Schottky gate and anode ohmic contact together, the turn-on voltage is determined by the threshold voltage of the channel instead of the Schottky barrier or p-n barrier.

In one preferred embodiment, a lateral field effect rectifier and a normally-off HEMT are manufactured on the same chip in one process and the HEMT is of the conventional Ni/Au gate metallization.

In one preferred embodiment, an integrated field effect rectifier and a normally-off HEMT are manufactured self-aligned in one process.

This integrated structure is particularly advantageous for power converter circuits. Lower $R_{on}$ means lower power consumption for power converter circuits, thus higher power conversion efficiency. This means that power converter modules which use the above technologies can be very compact and lightweight, with smaller heatsinks to control temperature. Because of the capability for higher switching frequencies the size of the reactive passive components can also be significantly reduced, with improved performance. High temperature tolerance allows such HEMTs to be used in high temperature and stringent environments.

In a further class of embodiments, the structures described above are integrated with a light-emitting diode structure. These embodiments permit a variety of new applications, including, for example, power converters with integrated failure indication, or a complete multivoltage and/or mains-operated LED lighting module.

The disclosed innovations, in various embodiments, provide one or more of at least the following advantages. (However, not all of these advantages result from every one of the innovations disclosed, and this list of advantages does not limit the various claimed inventions.)

Compatibility with high ambient temperature;
Improved tolerance for electrical noise;
High power conversion efficiency;
Conveniently simple fabrication process;
Reduced thermal inefficiency;
Higher switching speeds;
Reduced size and weight;
Use of smaller heatsinks;
Use of smaller passive reactances;
Self-aligned process for ease of manufacture;
New integration of complex functionality on a single chip; and
Reduced cost in manufacturing.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF SAMPLE EMBODIMENTS

Figure 1:
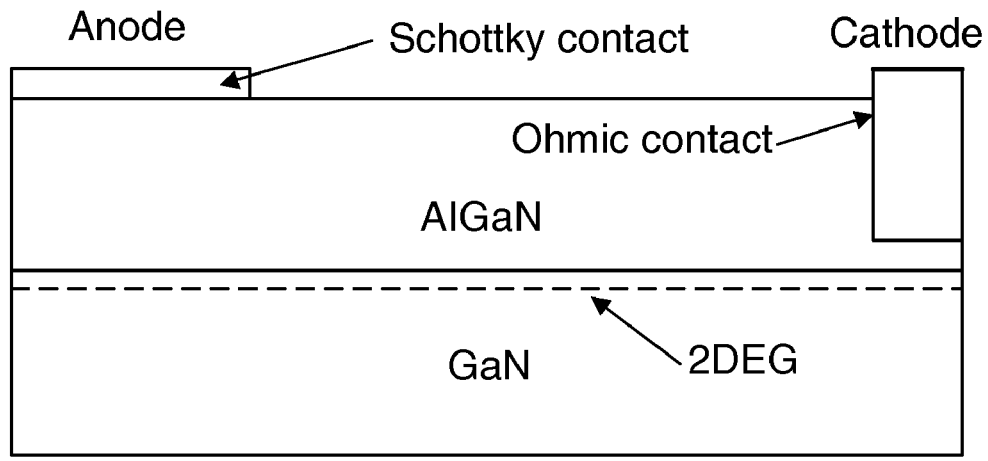
FIG. 1 is the cross-section of a conventional AlGaN/GaN SBD structure.
Figure 2:
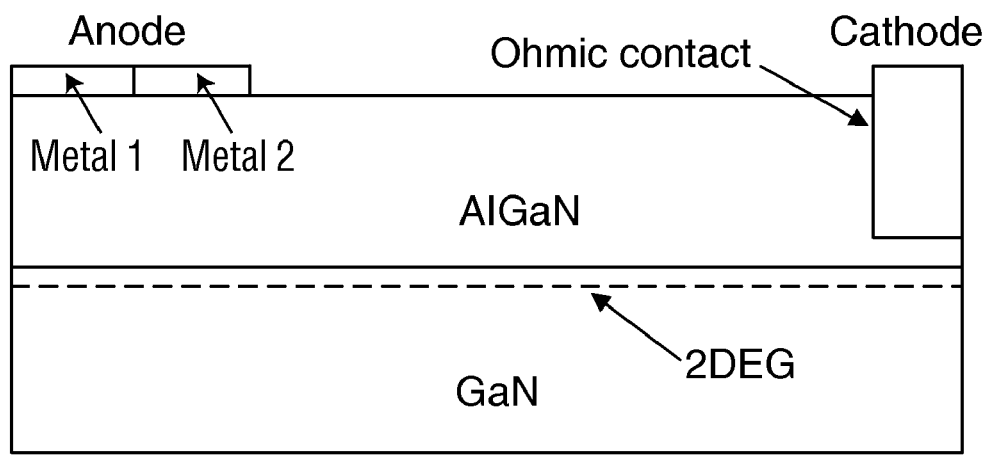
FIG. 2 is the cross-section of a dual-metal AlGaN/GaN SBD structure.

The numerous innovative teachings of the present application will be described with particular reference to presently preferred embodiments (by way of example, and not of limitation). The present application describes several inventions, and none of the statements below should be taken as limiting the claims generally.

For simplicity and clarity of illustration, the drawing figures illustrate the general manner of construction, and description and details of well-known features and techniques may be omitted to avoid unnecessarily obscuring the invention. Additionally, elements in the drawing figures are not necessarily drawn to scale, some areas or elements may be expanded to help improve understanding of embodiments of the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

It is contemplated and intended that the design in the present application can be applied to other 2DEG type rectifiers and field effect transistors; for clarity, the examples are based on single simple AlGaN/GaN vertical layered heterostructure, and with one rectifier and one HEMT on the chip. However, an ordinary person in the art would know the variations to modify the design to make other combinations and forms of designs, for example in horizontal layers.

Figure 3:
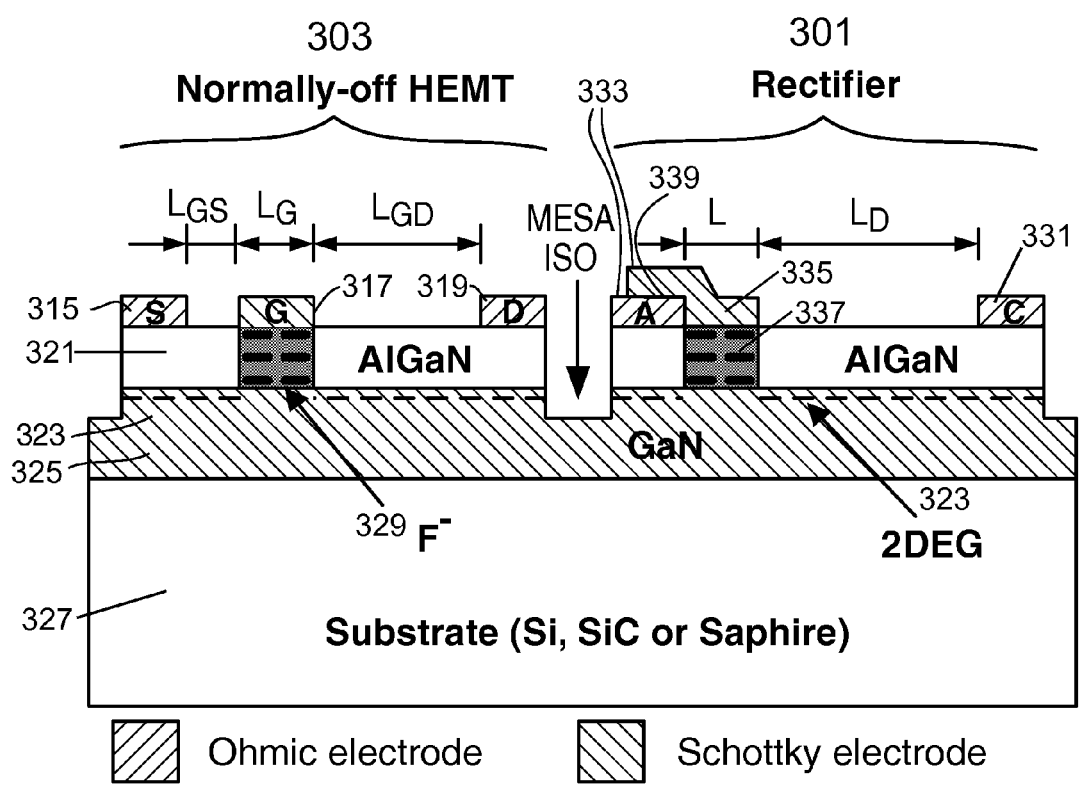
FIG. 3 is the cross-section of an AlGaN/GaN HEMT-compatible power lateral field-effect rectifier structure in accordance with the present application.

FIG. 3 shows a schematic cross-section of the power lateral field-effect rectifier (L-FER) 301 integrated with a normally-off HEMT 303. Dimension L is the length of the Schottky contact region (Fluorine ion implantation length), and dimension $L_D$ is the length of the drift region of the L-FER 301. Dimension $L_{GS}$ is the gate-source distance, $L_G$ is the gate length, and $L_{GD}$ is the gate-drain distance of HEMT 303. HEMT 303 includes a source 315, a gate 317, and a drain 319 on the surface of AlGaN layer 321 over GaN layer 325. At the heterojunction between AlGaN layer 321 and GaN layer 325, a 2DEG electron gas 323 forms. (In the ON state, the voltage applied to the gate electrode will invert a portion of the semiconductor material to form an extension of this 2DEG which completes the circuit from source to drain.) AlGaN layer 321 over GaN layer 325 are grown over a substrate layer 327, that is usually made of Si, SiC, Sapphire or GaN. In the AlGaN layer and underneath the gate 317 is a region 329 containing permanently negatively charged ions, generally fluorine ions ($F^-$) which have been introduced by $CF_4$ plasma treatment or by ion implantation. Region 329 may also extend into the GaN layer. Details of F— implantation are described in US patent publication US 2007/0278518 A1 to the inventor of this application, Chen et al, which is hereby incorporated by reference in its entirety.

The structure of L-FER 301 is somewhat similar to that of an AlGaN/GaN normally-off HEMT structure. L-FER 301 also contains AlGaN layer 321 over GaN layer 325. Between AlGaN layer 321 and GaN layer 325, forms the 2DEG electron gas channel 323. AlGaN layer 321, and underlying GaN layer 325, are successively grown over a substrate layer 327, typically of Si, SiC, Sapphire or GaN. On the surface of AlGaN layer 321 sits the cathode electrode 331. Cathode 331 is made of an electrode in ohmic contact with the AlGaN layer (and hence with the underlying 2DEG), and the anode electrode 333 is made of electrically shorted Schottky contact 335 and ohmic contact 339. Underneath the Schottky contact 335, is a region 337 containing permanently negatively charged ions. Although other negative ions are contemplated, generally fluorine ions ($F^-$) are the one implanted, either by CF4 plasma treatment or by ion implantation. Region 337 may vertically extend into the GaN layer.

Note that lateral isolation between the rectifier and the transistor is provided, in this example, by mesa isolation.

The introduction of permanently negatively charged region 337 here effectively depletes the 2DEG under the Schottky contact, and hence pinches off the 2DEG conduction path. The pinch-off provides therefore the reverse blocking capability of an L-FER. When a positive forward bias is applied to the anode electrode 333, the 2DEG 323 will be induced under the Schottky contact region 335 and the channel starts to be "ON". When a negative bias is applied to the anode 333, the channel remains "OFF". Thus, the two-terminal 301 operates as a field-effect rectifier.

Figure 4A:
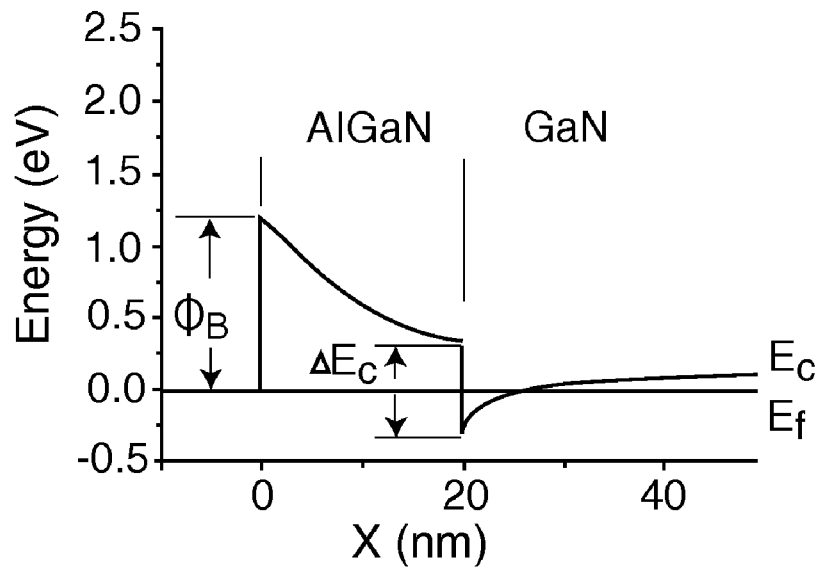
FIGS. 4(a)-4(c) show the comparative effects on the conduction-band diagrams and the electron concentrations with/without fluorine ion implantation in an AlGaN/GaN HEMT.
Figure 4B:
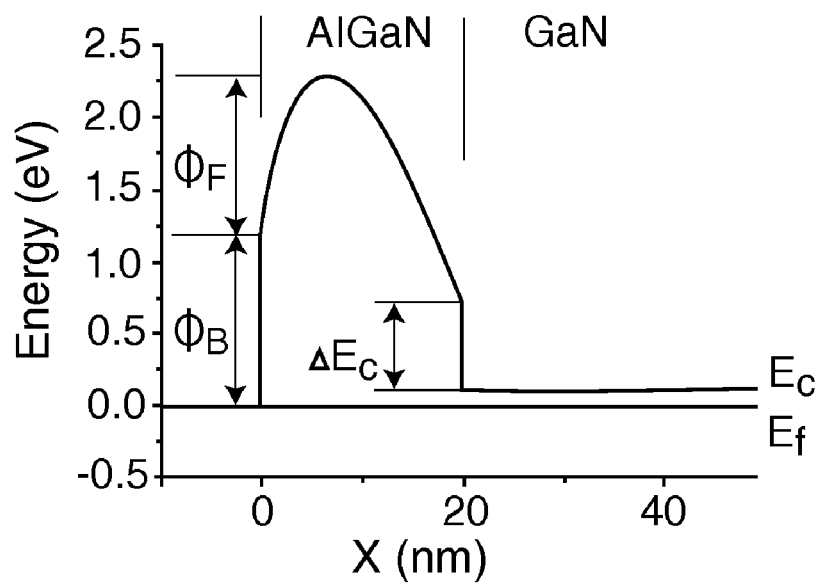
Figure 4:
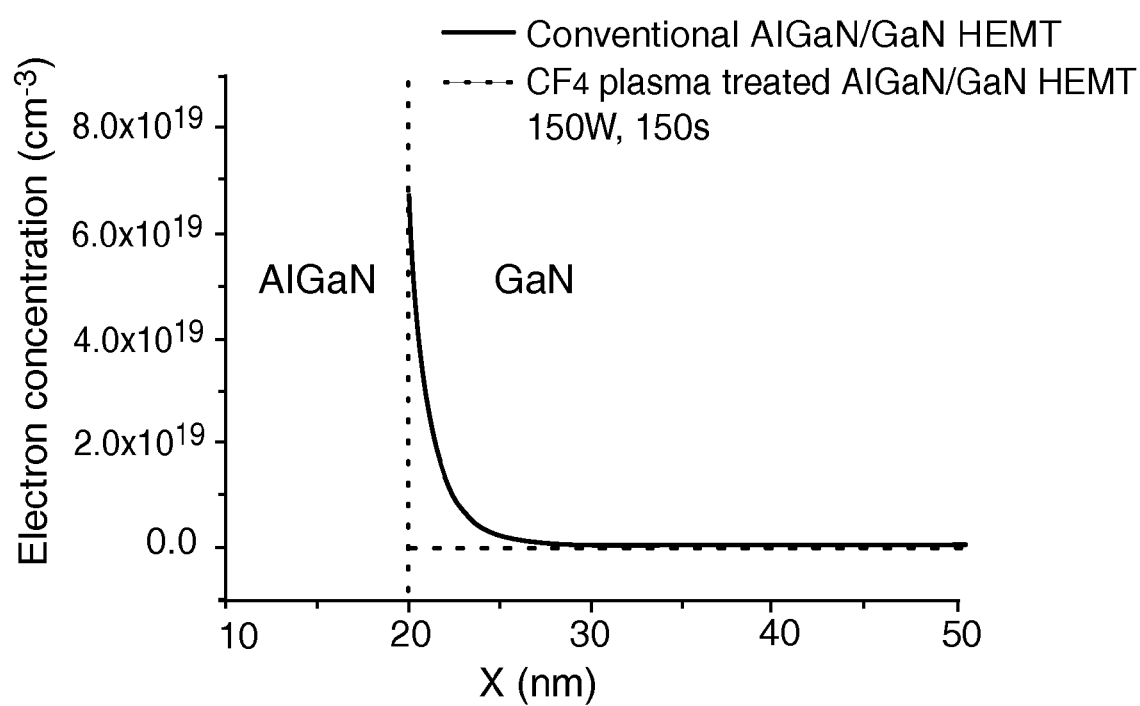

FIG. 4(a) shows the simulated conduction-band diagrams for the structure of FIG. 3 without fluorine ion implantation at zero gate bias. FIG. 4(b) shows the simulated conduction-band diagrams for the structure of FIG. 3 with fluorine ion implantation at zero gate bias. FIG. 4(b) shows that the fluorine ion treatment causes the conduction-band bending upward, especially in AlGaN barrier, yielding an additional barrier height $\Phi_F$. Note also that the conduction-band minimum of the 2DEG channel of the fluorine-treated structure is above Fermi level, indicating a completely depleted channel. The enhanced barrier will significantly suppress the reverse leakage current of the Schottky contact region. FIG. 4(c) shows the electron profiles of the fluorine treated and untreated structures. There are no electrons in the channel under the zero gate bias in the plasma-treated structure, indicating a normally-off device.

Figure 5:
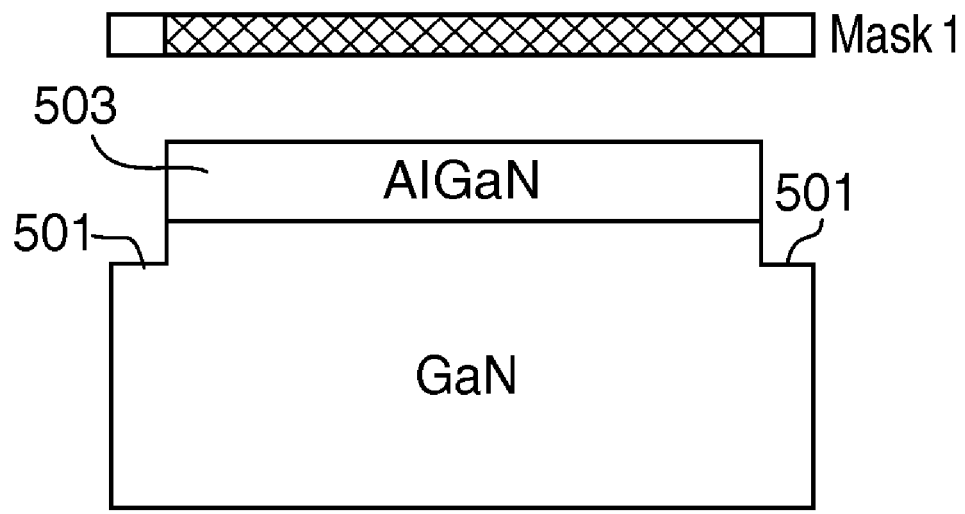
FIGS. 5(a)-5(e) demonstrate an example manufacturing process for an AlGaN/GaN HEMT-compatible power lateral field-effect rectifier in accordance with the present application.
Figure 5:
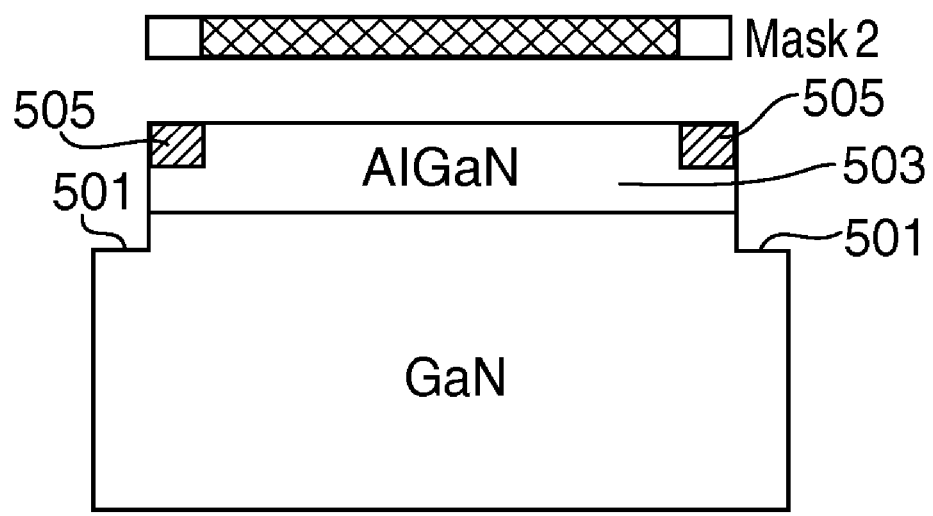
Figure 5:
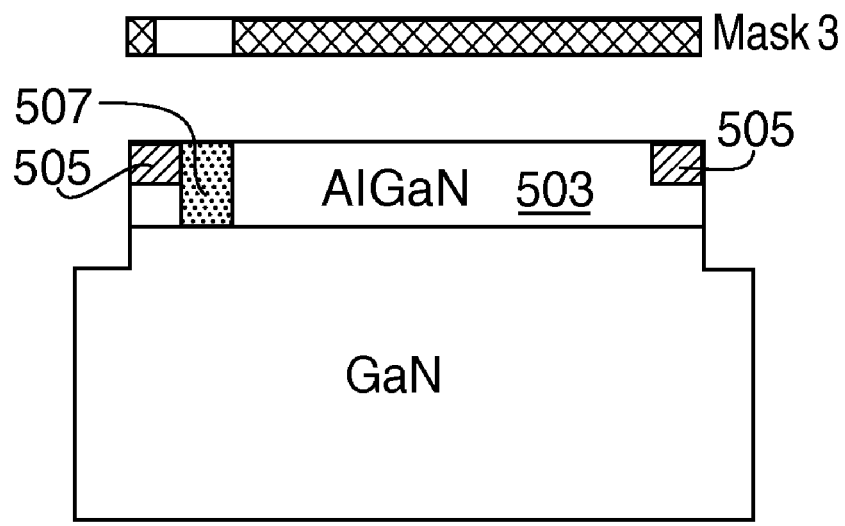
Figure 5:
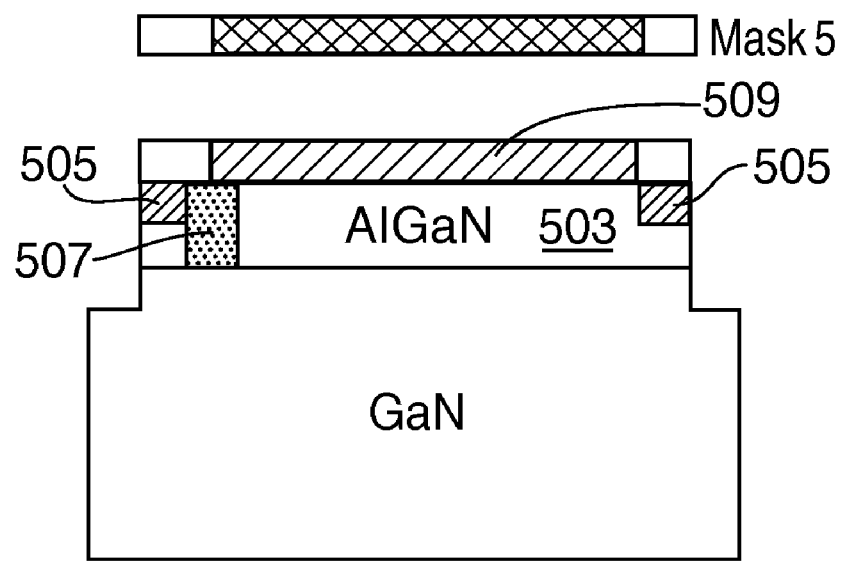
Figure 5:
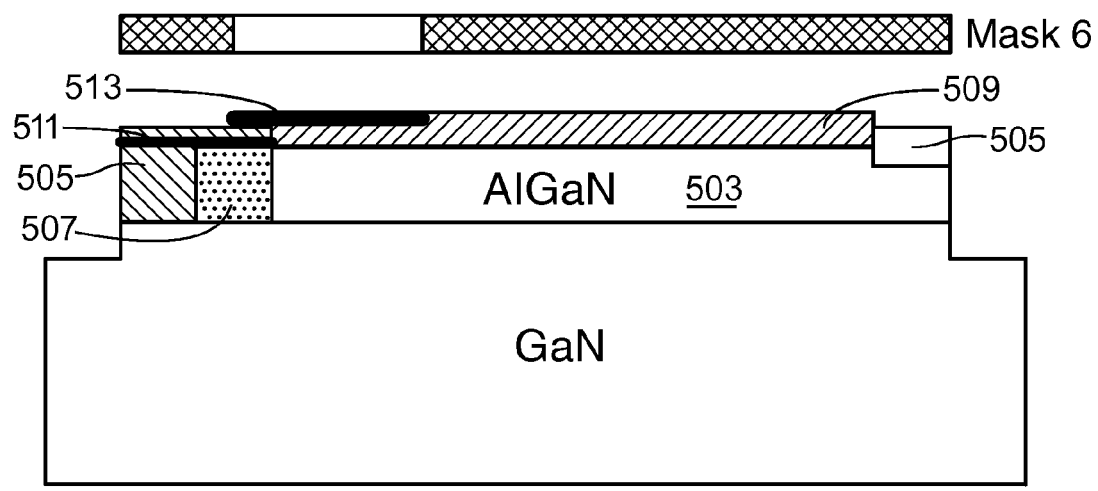

FIGS. 5(a)-5(e) show an example of a fabrication process for the lateral field-effect rectifier structure shown in FIG. 3. In FIG. 5(a), a device mesa 501 was formed on AlGaN/GaN surface 503. In this example, this step was implemented using a $Cl_2$/He plasma dry etching in an inductively coupled plasma reactive ion etching (ICP-RIE) system. This pattern is defined by a first patterning step, here shown symbolically as Mask1.

In FIG. 5(b) the Ohmic contacts 505 are formed. In this example, this step was implemented by a deposition of e-beam evaporated Ti/Al/Ni/Au (20 nm/150 nm/50 nm/80 nm) and rapid thermal annealing (RTA) at 850° C. for 30 s with Mask2.

In FIG. 5(c) a fluorine ion implantation 507 is implemented next to Ohmic contact region 505 and self-aligned to define the electrode contact, with Mask3. The fluorine ion implantation is controlled in order to optimize the trade-off between the reverse blocking capability and the turn-on voltage.

In FIG. 5(d) a passivation layer 509 (e.g. 300 nm thickness of $SiN_x$) is deposited, e.g. by the PECVD with Mask5. In FIG. 5(e) the probing pads 511 and field plate (FP) 513 are defined and formed with Mask6. Finally, the sample is preferably annealed, e.g. at 400° C. for 10 min, to repair the plasma-induced damage in the AlGaN barrier.

Figure 6:
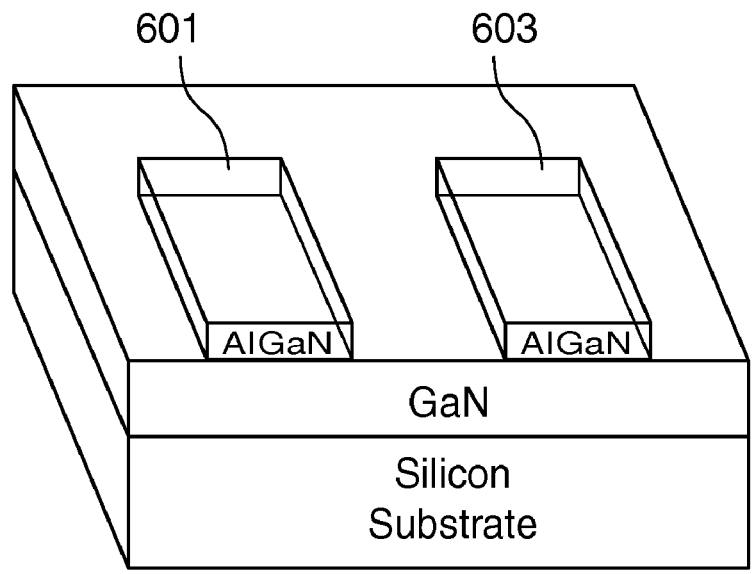
FIGS. 6(a)-6(d) demonstrate an example of a manufacturing process for a normally-off AlGaN/GaN HEMT integrated with a lateral field-effect rectifier on the same chip in accordance with the present application.
Figure 6:
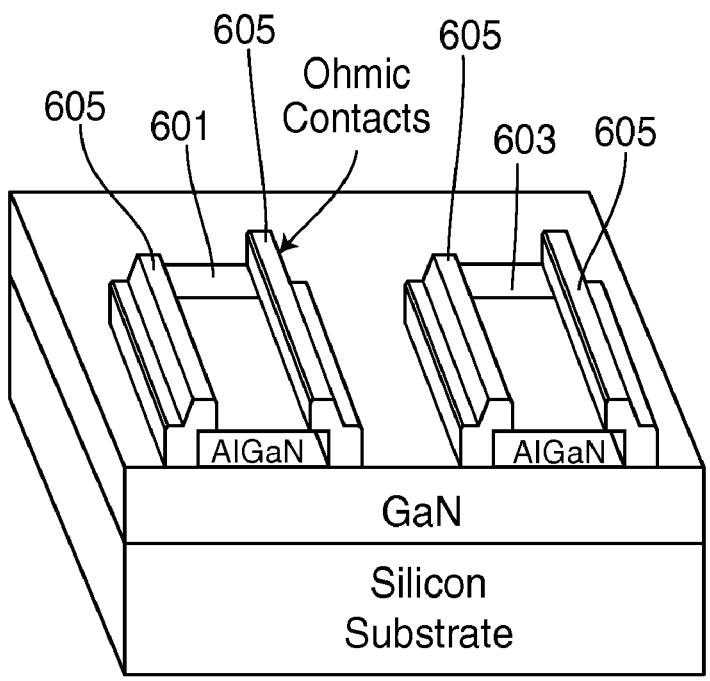

FIGS. 6(a)-6(d) show an example of a similar manufacturing process for fabricating an integrated lateral field-effect rectifier and a normally-off HEMT on one chip. In FIG. 6(a) a device mesa was formed using a $Cl_2$/He plasma dry etching in an inductively coupled plasma reactive ion etching (ICP-RIE) system. Multiple structure areas may be formed. The figures display two representative structure areas 601 and 603.

In FIG. 6(b) the ohmic contacts 605 are formed by a deposition of e-beam evaporated Ti/Al/Ni/Au (20 nm/150 nm/50 nm/80 nm) and rapid thermal annealing (RTA) at 850° C. for 30 s. This step forms contacts on both the rectifier and the HEMT.

Figure 6C:
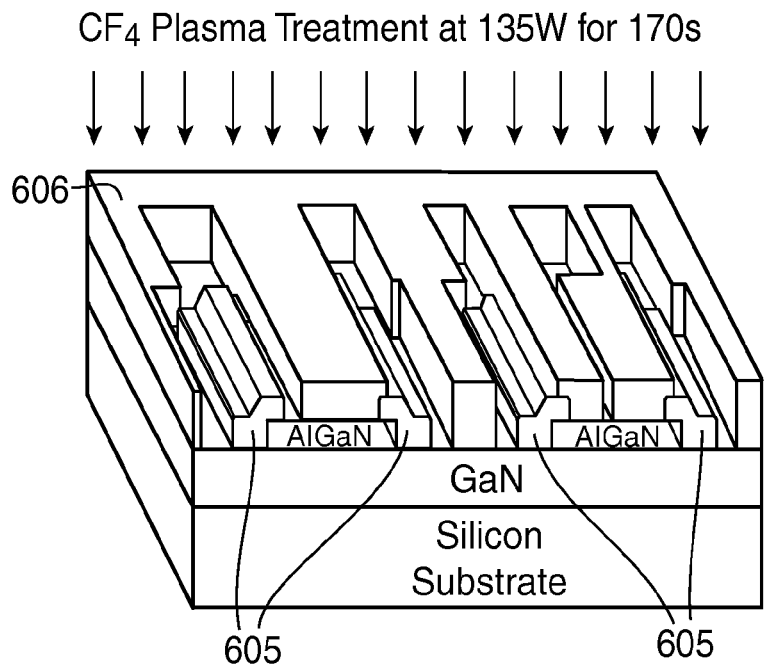

In FIG. 6(c), a fluorine-based plasma treatment is implemented, self-aligned to the Schottky electrode locations, using mask 606. Fluorine implantation regions 609 and 613 are formed for the rectifier and the HEMT respectively. Fluorine implantation region 609 is self-aligned to the edge of the anode ohmic contact of the rectifier 601, and fluorine implantation region 613 is more to the middle between the two contacts of the HEMT 603.

Figure 6D:
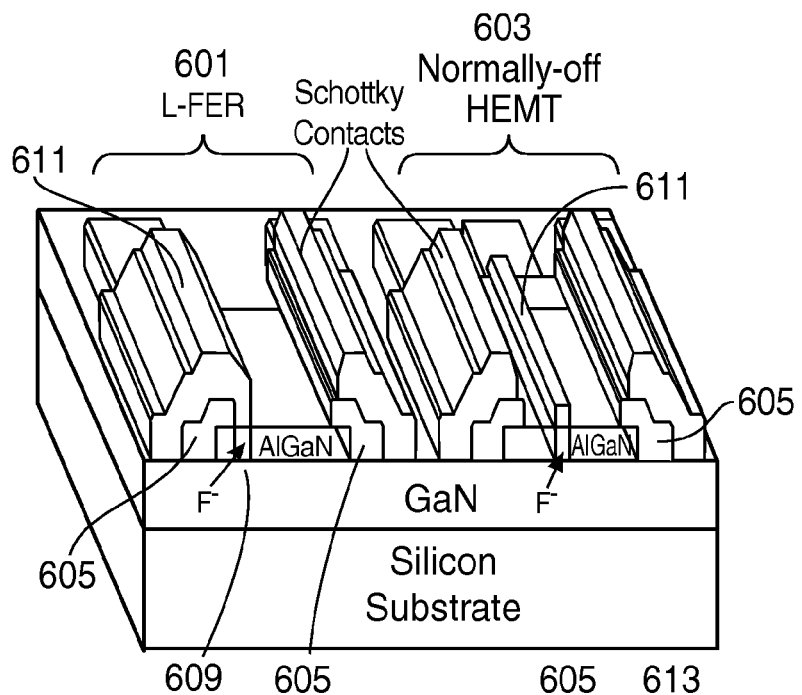

The Fluorine implantation is controlled in order to optimize the trade-off between the reverse blocking capability and the turn-on voltage. This implantation is followed, in this example, by the e-beam evaporation of Ni/Au Schottky contact 611 as shown in FIG. 6(d). In the anode region of the rectifier 601, the Schottky contact 611 is deposited on the uncovered surface of the fluorine implantation region of the AlGaN surface, forming an electrically shorted Schottky contact and ohmic contact in rectifier 601. In the HEMT 603 region, the Schottky contact 611 is deposited on the uncovered surface of the fluorine implantation region forming the gate.

Subsequently, a post-gate annealing at 400° C. for 10 minutes was carried out to remove the plasma-induced lattice damages and defects. Finally, a 300 nm thickness $SiN_x$ passivation layer is deposited by the plasma enhanced chemical vapor deposition.

A sample device structure of FIG. 3 is fabricated by using commercially available $Al_{0.26}Ga_{0.74}N$/GaN HEMT wafer grown by metal organic chemical vapor deposition (MOCVD) on silicon substrate. The epitaxial structure includes a GaN buffer, a thin AlN interface enhancement layer, a ~18 nm undoped AlGaN layer and a 2 nm undoped GaN cap. The starting wafer features a sheet resistance of 320 ohm/square, 2DEG mobility of 1800 $cm^2$/V•s and a pinch off voltage of −2.1 V. The specific contact resistance of ~1.0 Ω.mm is obtained using a standard transfer length method (TLM) procedure. Prior to the e-beam evaporation of Ni/Au, Schottky contact regions are treated by $CF_4$ plasma at 130 W for 150 sec. The negatively charged fluorine ions effectively deplete the 2DEG channel and shifts the channel's pinch-off voltage from −2.1 V to +0.2 V. Subsequently, a post-gate annealing at 400° C. for 10 minutes was carried out to remove the plasma-induced lattice damages and defects. For comparison, SBDs directly formed on the AlGaN surface region untreated by $CF_4$ plasma are also fabricated with one additional Ni/Au metallization step. Finally, a 300 nm thickness $SiN_x$ passivation layer is deposited by the plasma enhanced chemical vapor deposition.

Figure 7B:
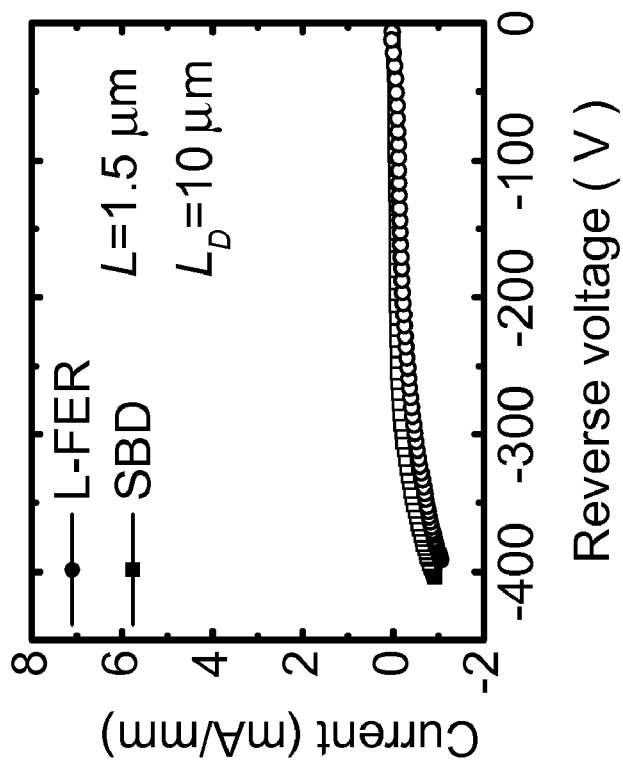
FIGS. 7(a) and 7(b) show the forward and reverse characteristics of a lateral field-effect rectifier fabricated in accordance with the present application.
Figure 7A:
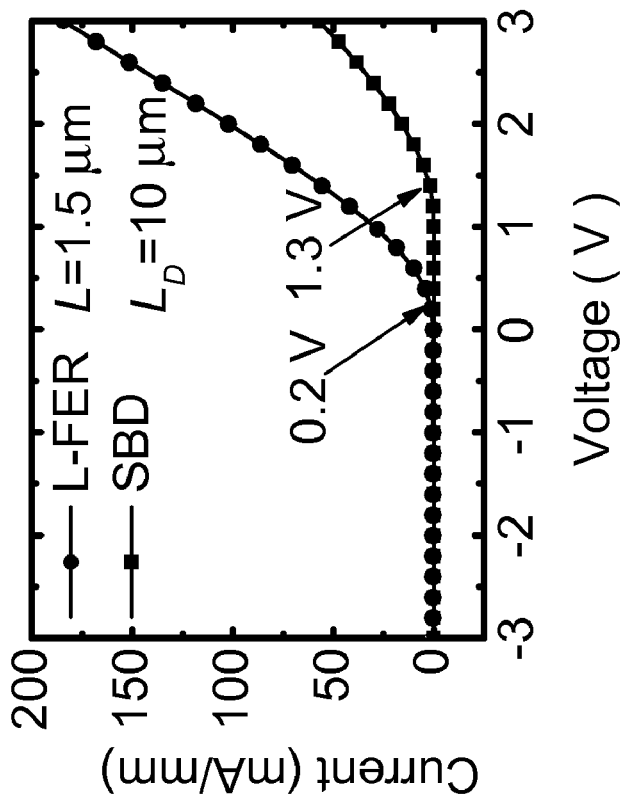

The forward characteristics of the above fabricated L-FER and the SBD with the same anode-cathode drift region length ($L_D$) of 10 μm and the same device width (W) of 100 μm are plotted in FIG. 7(a). The knee voltage ($V_k$, defined as the anode bias at a forward current of 1 mA/mm) is 0.2 V in the L-FER and 1.3 V in the SBD. This large difference is a result of the different turn-on mechanisms in the two devices. In L-FER, $V_k$ is decided by the pinch-off voltage of the channel, and can be well adjusted and controlled by the fluorine plasma power and implantation time. For the SBDs formed on AlGaN/GaN HEMT, $V_k$ is determined by the metal/AlGaN Schottky barrier as well as the conduction band offset at the AlGaN/GaN heterointerface. The specific on-resistance ($R_{ON,sp}$) is 1.4 mΩ·cm² in the L-FER, where $R_{ON,sp}$ is calculated in the forward bias range of 2 V to 3V using the area of the active region excluding the ohmic contacts. The reverse breakdown characteristics of the two devices were measured using Tektronix 370A curve tracer without immersing the devices in Fluorinert, and are plotted in FIG. 7(b). The L-FER and SBD with the same drift region length of 10 μm exhibit nearly-identical reverse breakdown voltage at a current of 1 mA/mm. The BV for L-FER with a 10 μm drift length is 390 V, leading to a power figure of merit ($BV^2/R_{ON,sp}$) of 108 MW·cm⁻², comparable to that reported in the vertical Schottky diode.

Figure 8A:
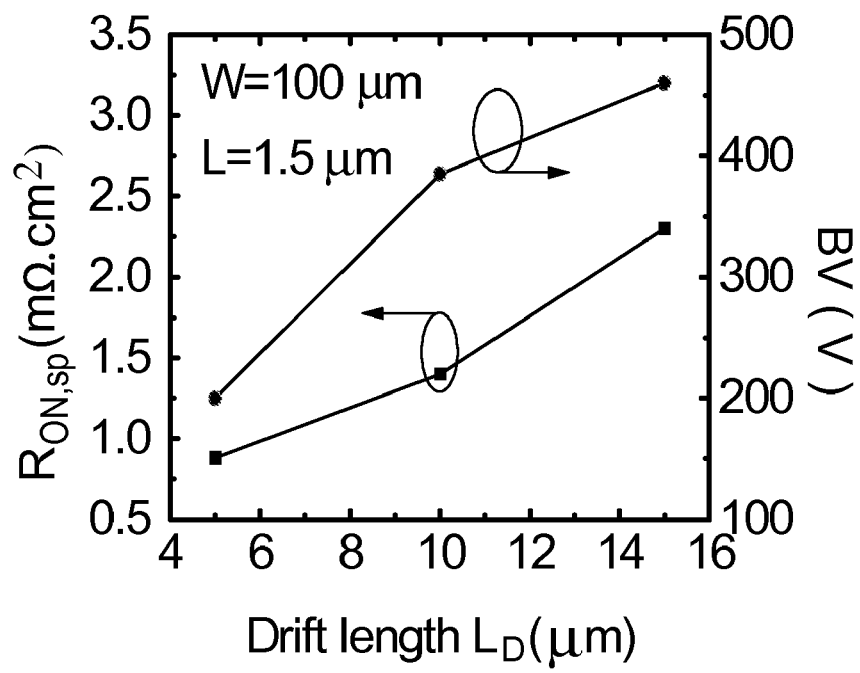
FIG. 8(a) shows the dependence of specific on-resistance and breakdown voltage on the drift length in the lateral field-effect rectifier fabricated in accordance with the present application.
Figure 8B:
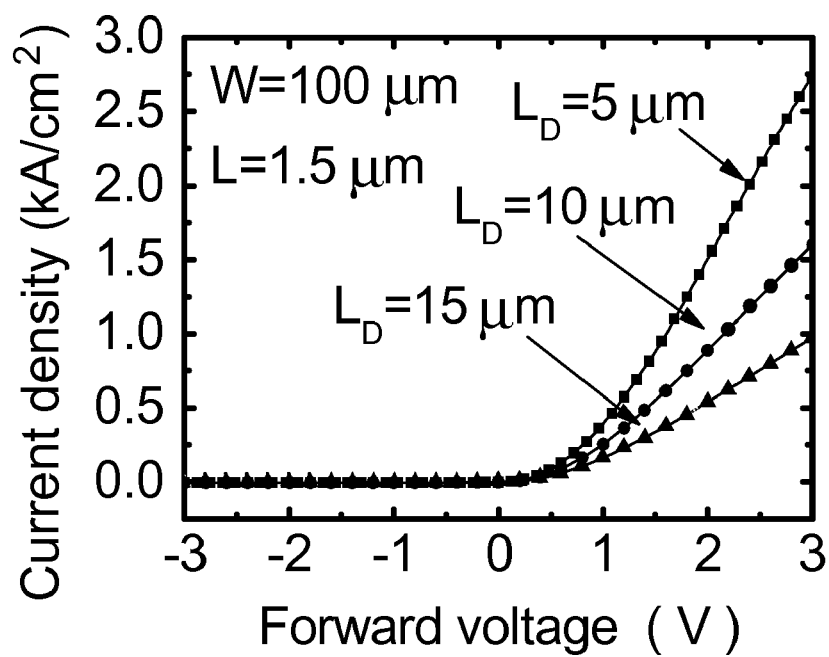
FIG. 8(b) shows the forward bias current-voltage characteristics of lateral field-effect rectifiers with a drift length of 5 μm, 10 μm, and 15 μm fabricated in accordance with the present application.

The dependences of $R_{ON,sp}$ and BV on the drift length ($L_D$) of the L-FER are plotted in FIG. 8(a). Both BV and $R_{ON,sp}$ are increased as the drift length increases. The forward turn-on characteristics of L-FERs with different drift lengths are plotted in FIG. 8(b). The forward turn-on voltage ($V_{F,ON}$) at a forward current density ($J_F$) 100 A/cm² is 0.53 V, 0.63 V and 0.78 V in L-FERs with $L_D$=5, 10 and 15 μm, respectively, significantly lower than those reported in the vertical SBDs and p-i-n rectifiers. The much lower $V_{F,ON}$ is attributed to the turn-on control scheme by the channel threshold voltage instead of Schottky junction or p-i-n junction. In addition, the high 2DEG density and mobility in the drift region enables the achievement of low on-resistance, which also leads to the low $V_{F,ON}$ in L-FER.

Figure 9:
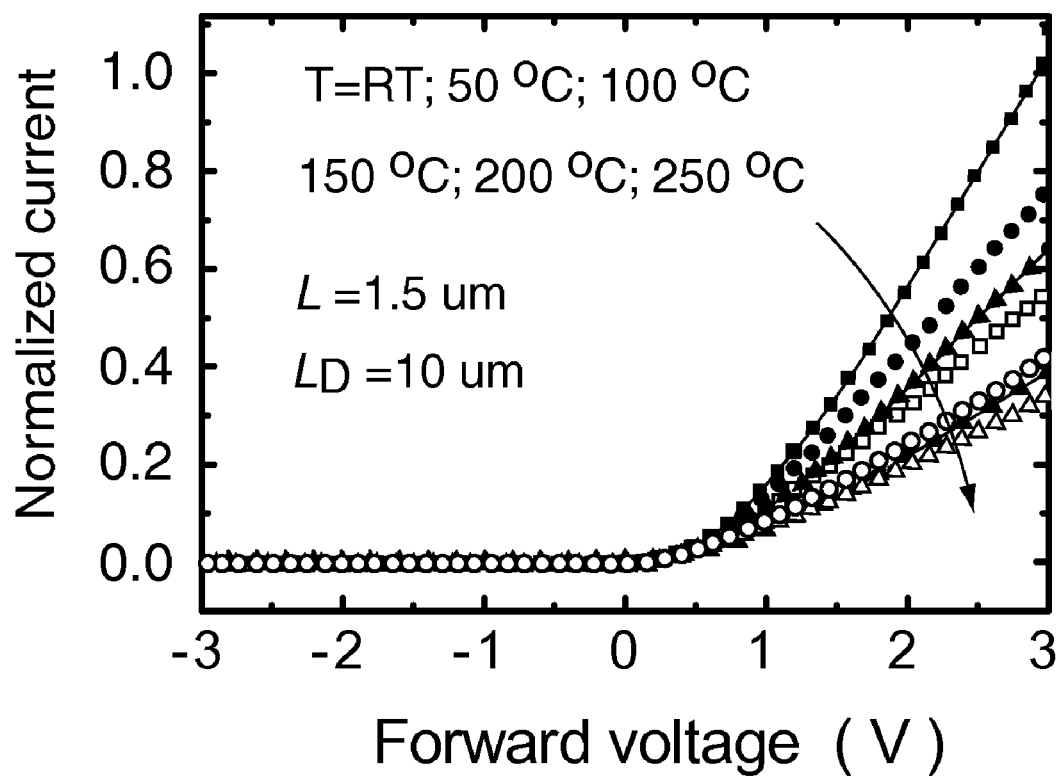
FIG. 9 shows the temperature dependence of the forward characteristics of a lateral field-effect rectifier fabricated in accordance with the present application. The currents are normalized against the current measured with 3 V forward bias at room temperature (RT).

FIG. 9 shows the temperature dependences of the forward bias characteristics in the L-FERs using a probe station with thermal chuck. $V_k$ shows little temperature dependence as the temperature rises to 250° C., although the current decreases with the increasing temperature. The main reason for the current decrease is that the 2DEG mobility of AlGaN/GaN is degraded at higher temperatures as a result of increased phonon scattering.

Figure 10:
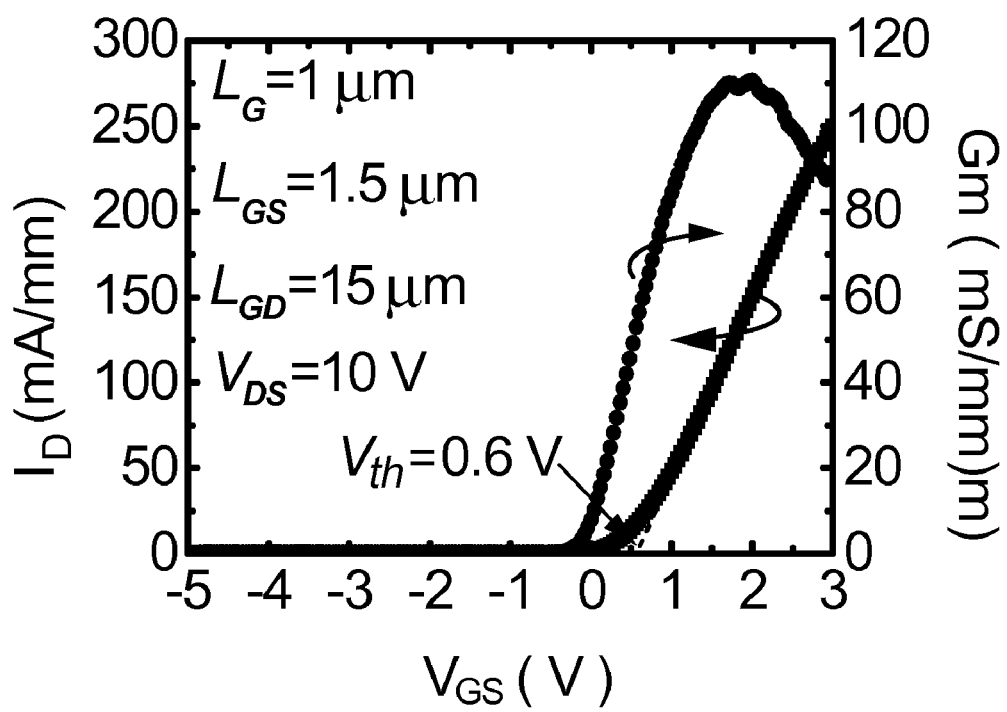
FIGS. 10(a)-10(b) show the performance of a normally-off HEMT manufactured in accordance with the present application: (a) transfer characteristics and (b) source-drain output characteristics.
Figure 10:
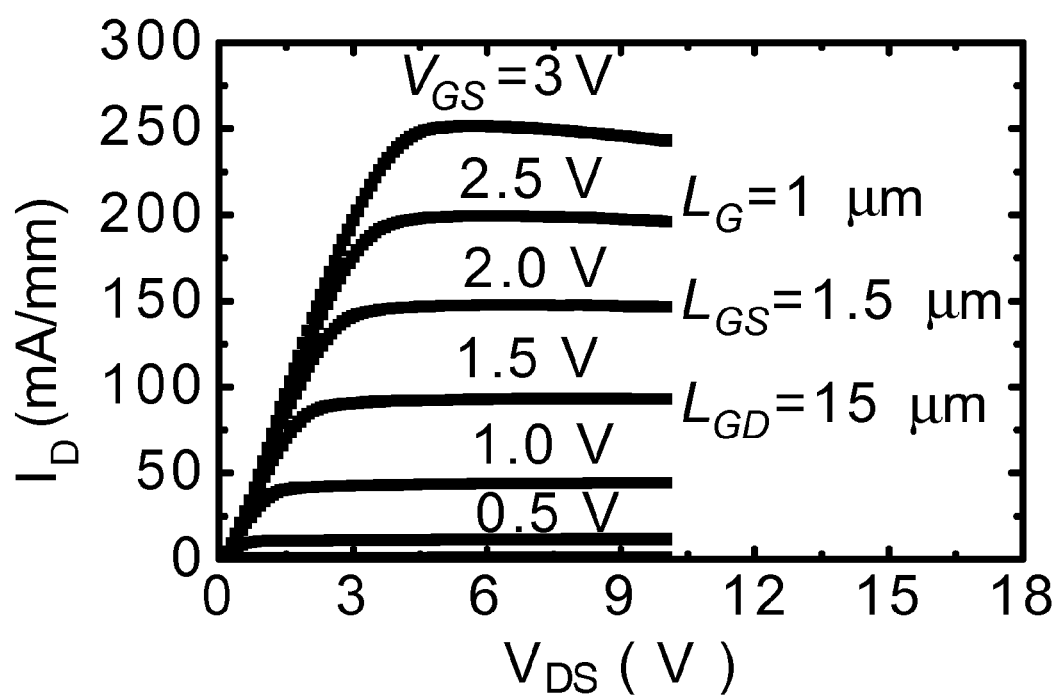

FIGS. 10(a) and 10(b) show the characteristics of a normally-off AlGaN/GaN HEMT fabricated during the same process. For a HEMT device with a 1 μm gate-to-source distance, 1.5 μm gate length and 15 μm gate-to drain distance, it exhibits a threshold voltage ($V_{th}$) of 0.6 V, a maximum drain current ($I_{max}$) of 250 mA/mm at $V_{GS}$=3 V and $V_{DS}$=10 V, and a peak trans-conductance (G) of 110 mS/mm. The off-state breakdown voltage is 460 V at a drain leakage current of 1 mA/mm and the specific on-resistance ($R_{ON,sp}$) is about 2.3 mΩ·cm² at $V_{GS}$=3 V.

Figure 11:
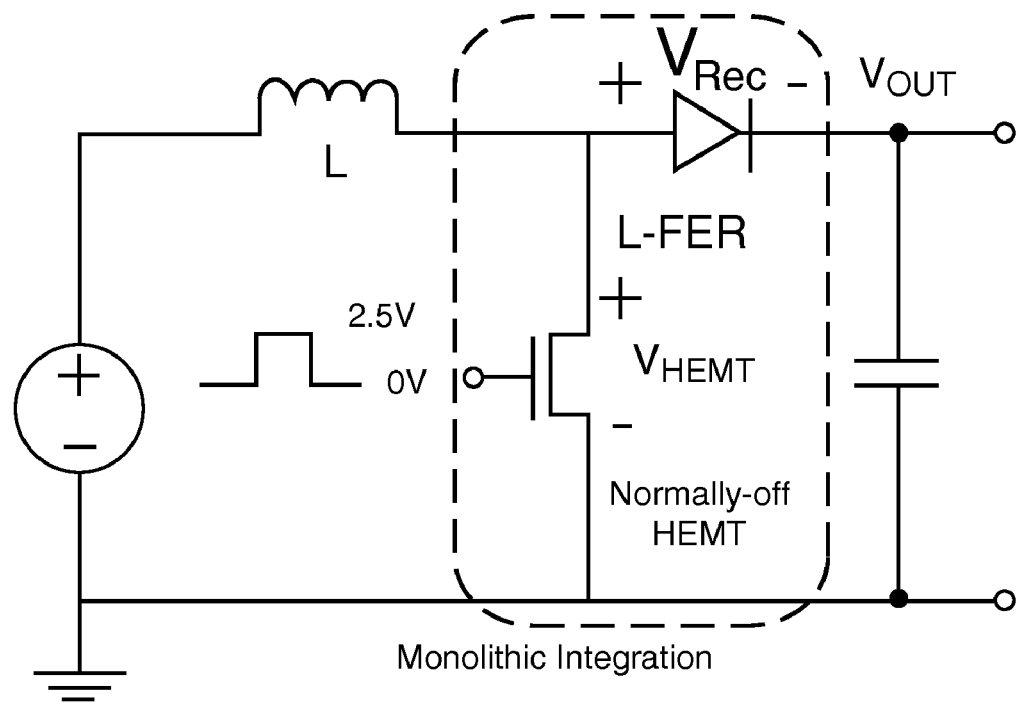
FIG. 11(a) shows an example of a single-chip GaN-based Boost converter containing an integrated AlGaN/GaN HEMT and power lateral field-effect rectifier chip in accordance with the present application.
FIG. 11(b) displays the measured waveforms of the Boost converter in FIG. 9(a).
FIG. 11(c) shows an integrated buck converter which combines a HEMT switch and a rectifier.

FIG. 11(a) shows a sample implementation of a single-chip Boost converter, which is a common component of switch-mode power supplies, using the integrated L-FER/HEMT pair in the chip.

Figure 11B:
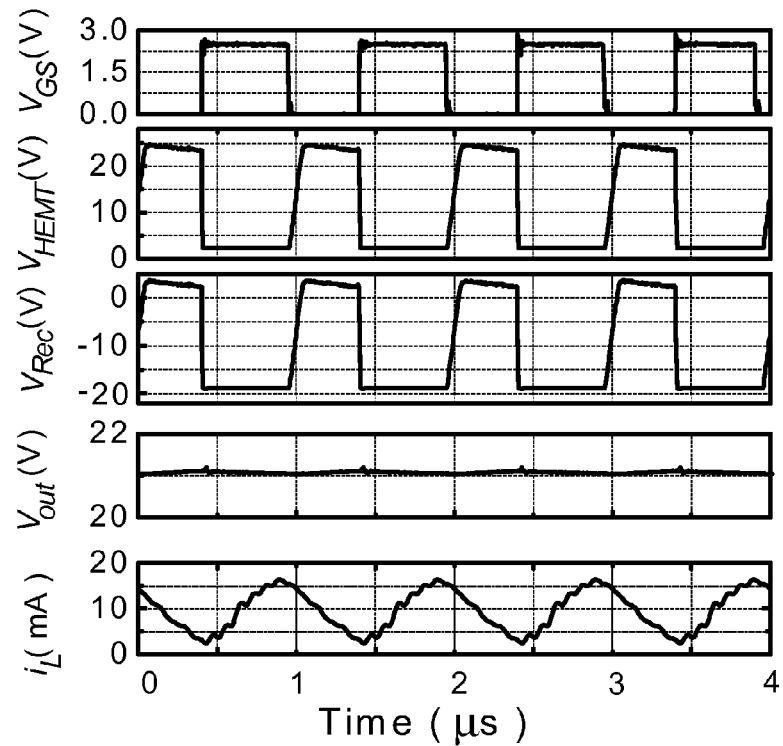

FIG. 11(b) shows the measured waveforms of the single-chip Boost converter operating at a switching frequency ($f_{sw}$) of 1 MHz, a duty cycle (D) of 55% and an input voltage ($V_{in}$) of 10 V. An output voltage ($V_{out}$) of 21 V and a power efficiency of 84% are obtained, with a 0.8% ripple level.

With integrated L-FER/HEMT on one chip, high efficiency power converters with high temperature operation and high reverse breakdown voltage can be produced at significantly reduced cost.

The disclosed structures provide convenient integration for switching power supplies, as well as for related applications (such as switch-mode motor drive circuits or audio amplifiers).

In general, a higher switching frequency is advantageous for switching power supply operation. Higher switching frequencies allow designers to achieve smaller physical size, faster transient response and smaller voltage over- and under-shoot. However, the frequency is also limited by the intrinsic response of the transistor switch and rectifiers, since these active devices are more lossy at higher frequency. Since GaN devices feature smaller loss at higher frequencies, the switching frequency can be raised further without paying penalty of reduced efficiency. Optimal choice of switching frequency is discussed, for example, in Nowakowski, "Choosing the Optimum Switching Frequency for DC-DC Converters," EE Times-India, October 2006; and in Omura et al., Gallium Nitride Power HEMT for High Switching Frequency Power Electronics, IEEE publication number 978-14244-17285 (2007). Both of these papers are hereby incorporated by reference in their entireties.

Figure 11C:
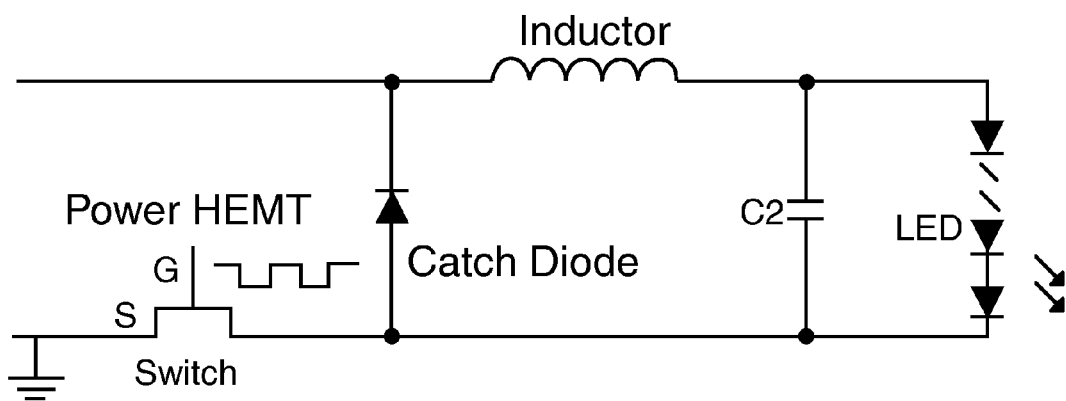

FIG. 11(c) shows an integrated buck converter which combines a HEMT switch and a rectifier. The power HEMT and the catch diode are preferably integrated together, as in one of the various embodiments above, and these elements are combined with two reactances as shown to form a simple power converter circuit. In the example shown these reactances would normally be discrete, as would the LEDs shown; but alternatively this circuit can also make use of integrated LEDs, as shown in any of FIGS. 16(a) through 16(c).

Figure 12:
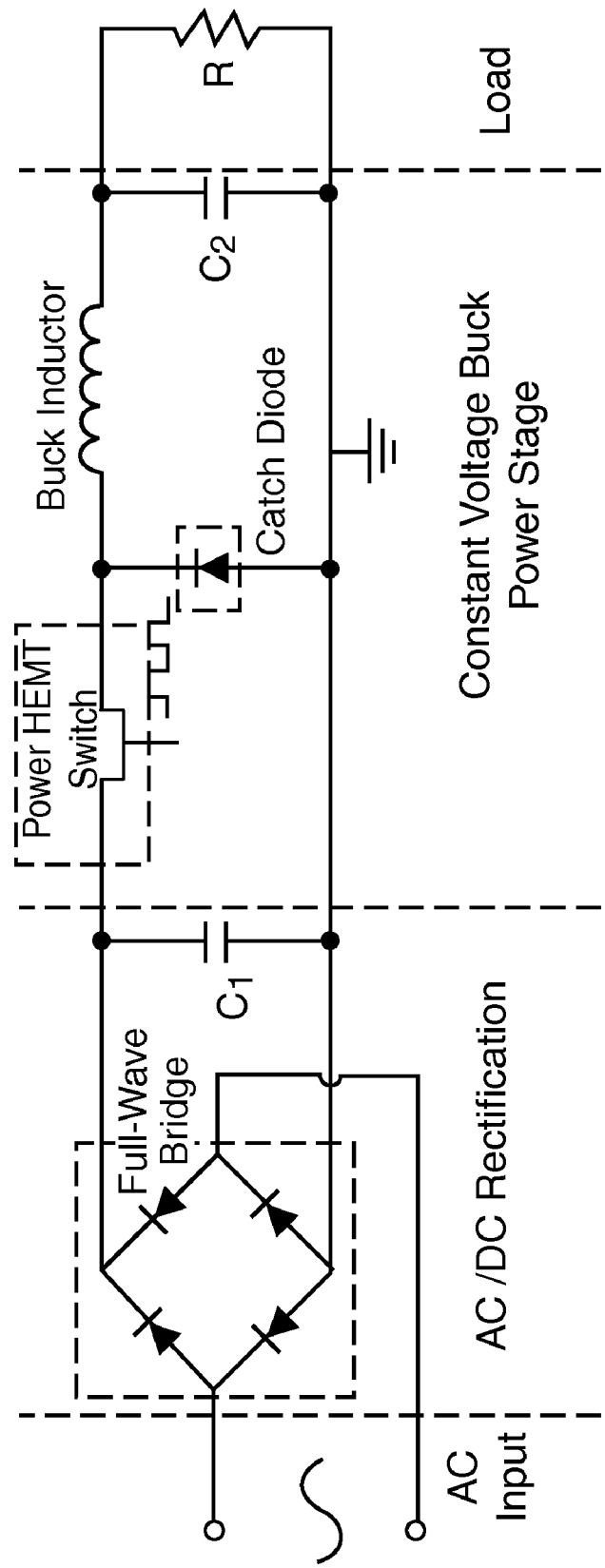
FIG. 12 shows an AC-DC converter featuring integration of rectifiers with a power HEMT switch.

FIG. 12 shows an AC-DC converter featuring rectifiers and power HEMT switch. A full-wave bridge is used for AC-DC rectification, and the buck converter is used for further step-down dc-dc conversion. Note that the full-wave bridge can be integrated with the power HEMT and catch diode. It is also possible to use such a configuration at much higher frequencies than mains frequencies, e.g. for modules which are remotely powered by RF.

Figure 13:
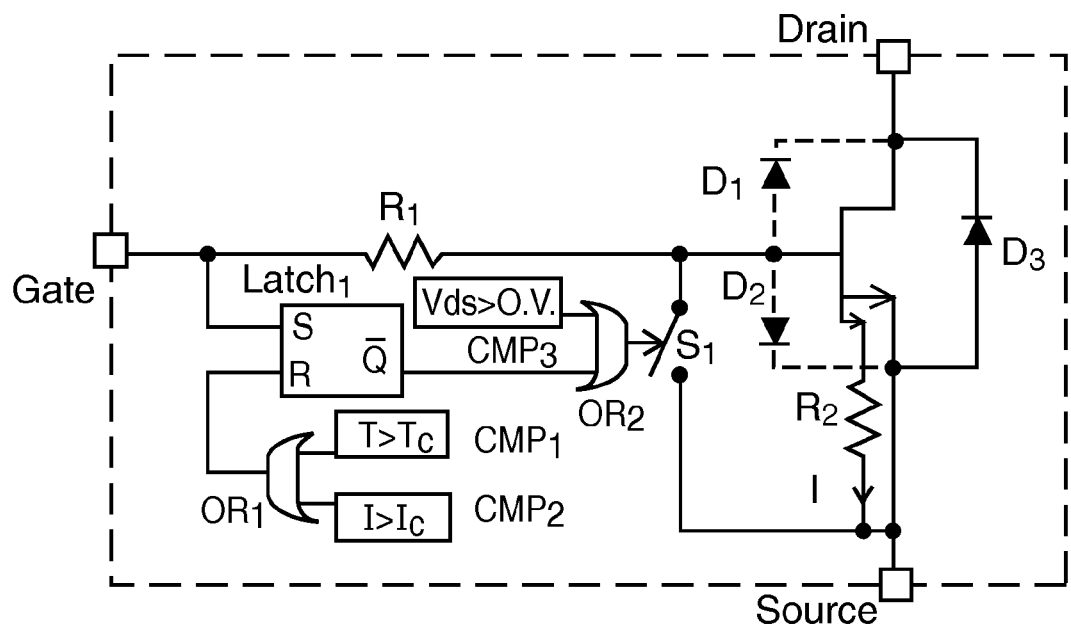
FIG. 13 shows a block diagram of an intelligent power switch.

FIG. 13 shows a block diagram of an intelligent power switch. This integrated high-speed device can be substituted for the operations of the IPS1041. (This unit and its data sheets and application notes are available from IR corporation, and are all hereby incorporated by reference.) In this unit, which is also referred as a "Smart Discrete", overvoltage protection (O.V.), current limiting, gate protection, over temperature protection, and free-wheeling diode are all combined in an integrated platform.

In FIG. 13, $D_1$ and $D_2$ are naturally formed by Gate-Source and Gate-Drain Schottky diodes; $D_3$ is formed by the L-FER structure described above; $R_1$ and $R_2$ are formed by 2DEG channel with our proposed plasma treatment to tune the resistance; comparators $CMP_1$, $CMP_2$, and $CMP_3$, OR gates $OR_1$ and $OR_2$, latch $LAT_1$, and switch $S_1$ are manufactured by our E/D Mode HEMT compatible process.

In this example, gate protection is performed by $D_1$ and $D_2$. Current limiting and over temperature protection are realized by sensing source current by $R_1$. Temperature protection is accomplished by a temperature sensor, combined with $CMP_1$, $CMP_2$, $OR_1$, $OR_2$, $LAT_1$, and $S_1$ to internally short the gate and source if required. Overvoltage protection is provided by $CMP_3$ and $OR_2$, which work similarly to the current limiting and overtemperature protection. Active clamping is activated by $D_1$ and $R_1$ when off, i.e. if the external gate and source are shorted. When the drain voltage exceeds the preset threshold value, diode $D_1$ will start to conduct and force the current flow through $R_1$. The voltage across $R_1$ will surpass the threshold voltage of the power transistor, which will open the channel and dissipate the voltage or current transient seen by the drain and source.

Figure 14:
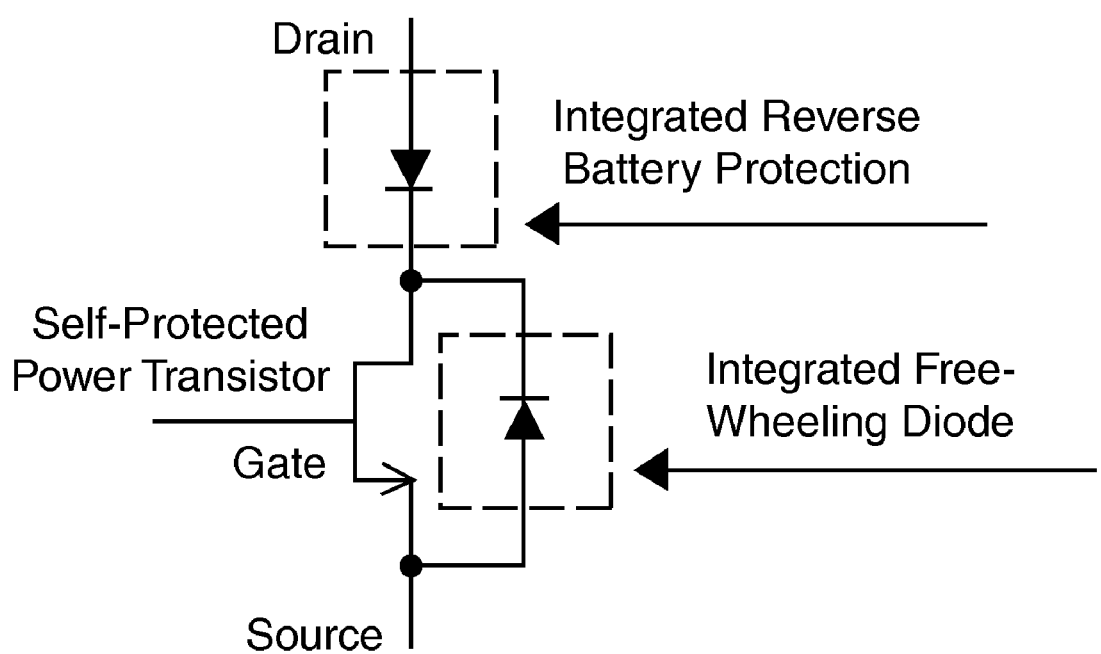
FIG. 14 shows an equivalent circuit diagram of a merged device structure.

FIG. 14 shows an equivalent circuit diagram of a merged device structure, in which a heterojunction transistor is combined with a freewheeling diode, according to any of the various device structures shown herein. The freewheeling diode is often used in power converter designs to clamp overvoltages on the source. Note also that this diode-transistor combination provides a synchronous rectifier structure, if such is desired. This Figure also shows a second diode which can provide protection against catastrophic overcurrent on the freewheeling diode, in case of supply polarity reversal.

Figure 15:
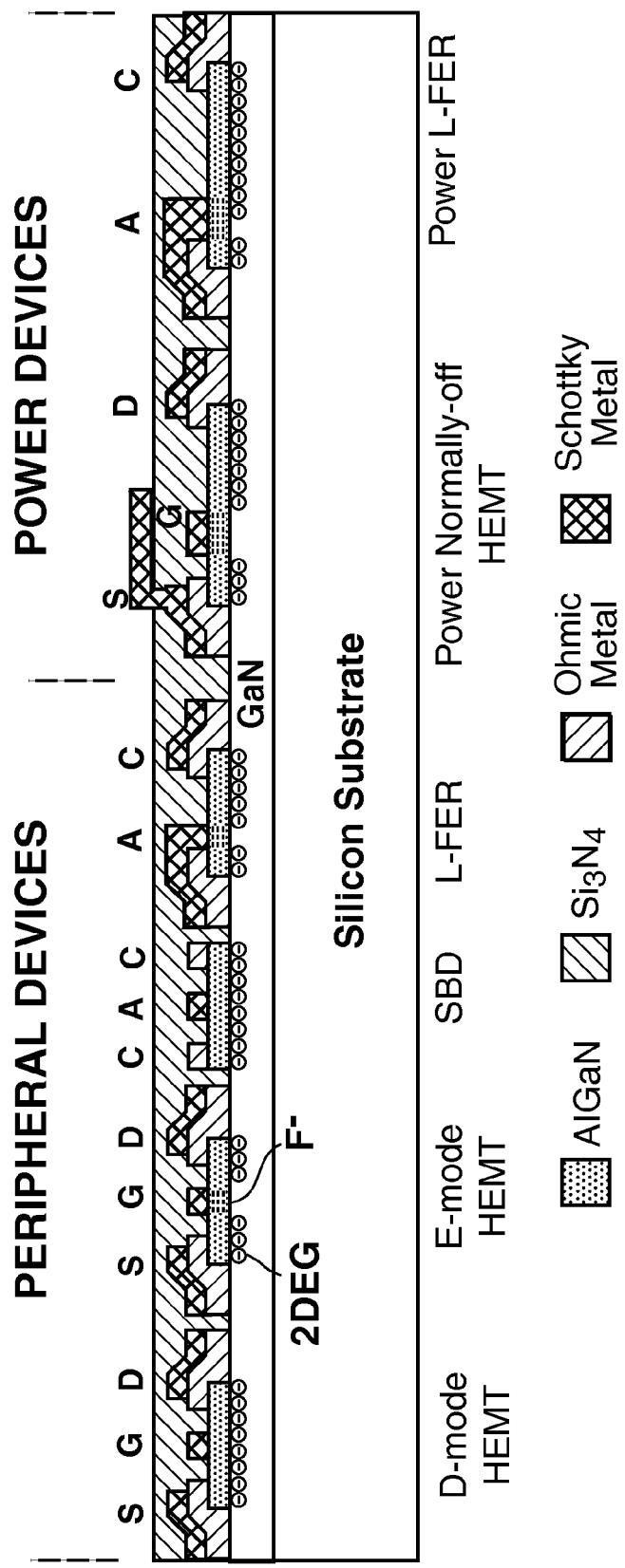
FIG. 15 shows of many of the different device types which can all be integrated together.

FIG. 15 provides an overview of the different device types which are integrated in the described implementation. Note that peripheral circuits can include both enhancement-mode and depletion-mode devices, as well as Schottky diodes and lateral field-effect rectifiers. The high-voltage section of the chip can include higher-voltage HEMTs and LFERs, with appropriate increase in lateral dimensions.

Figure 16A:
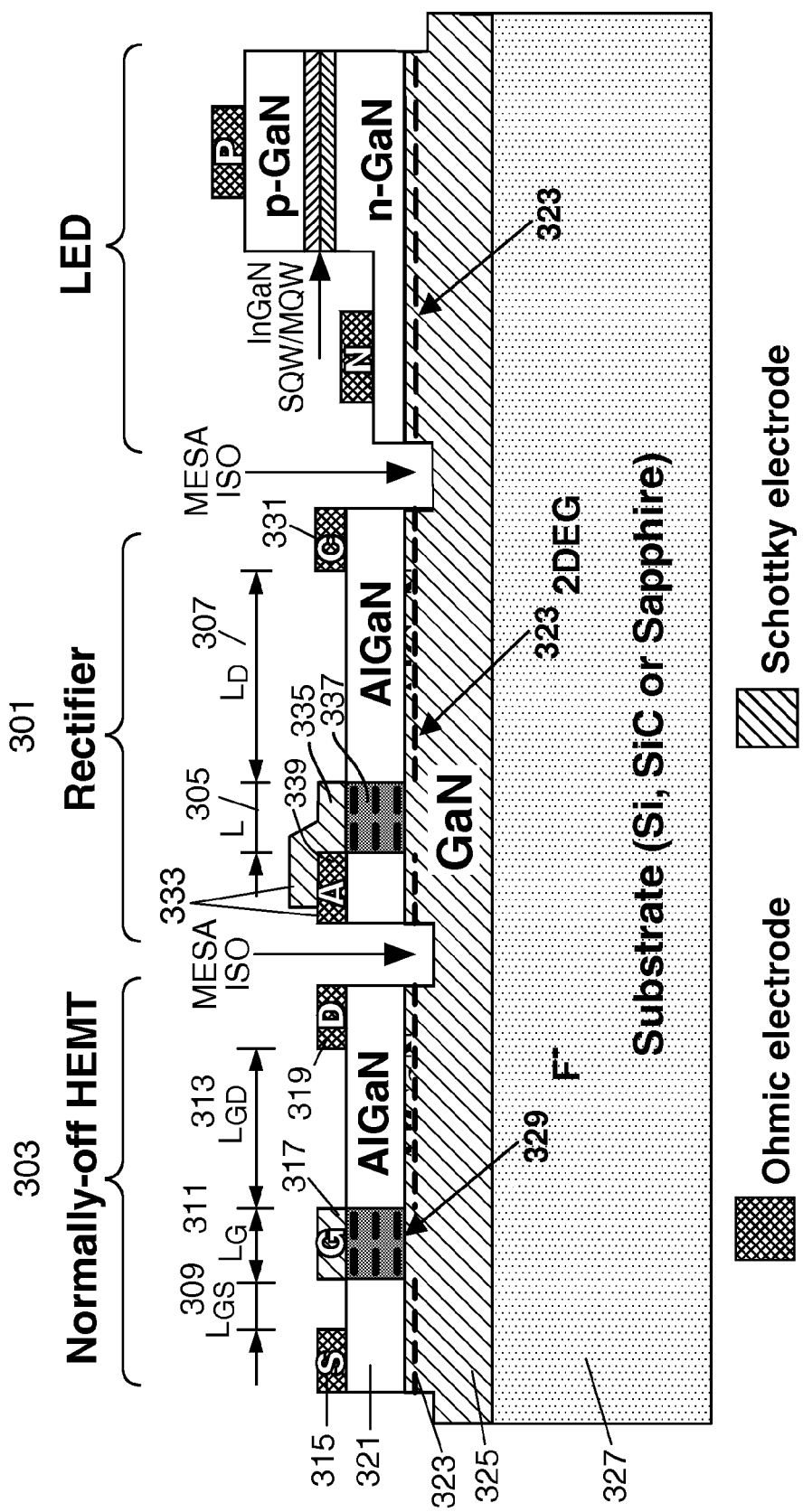
FIGS. 16(a)-16(c) show three more integrated structures and methods, in which diodes and transistors are integrated with various light-emitting diode structures.
Figure 16B:
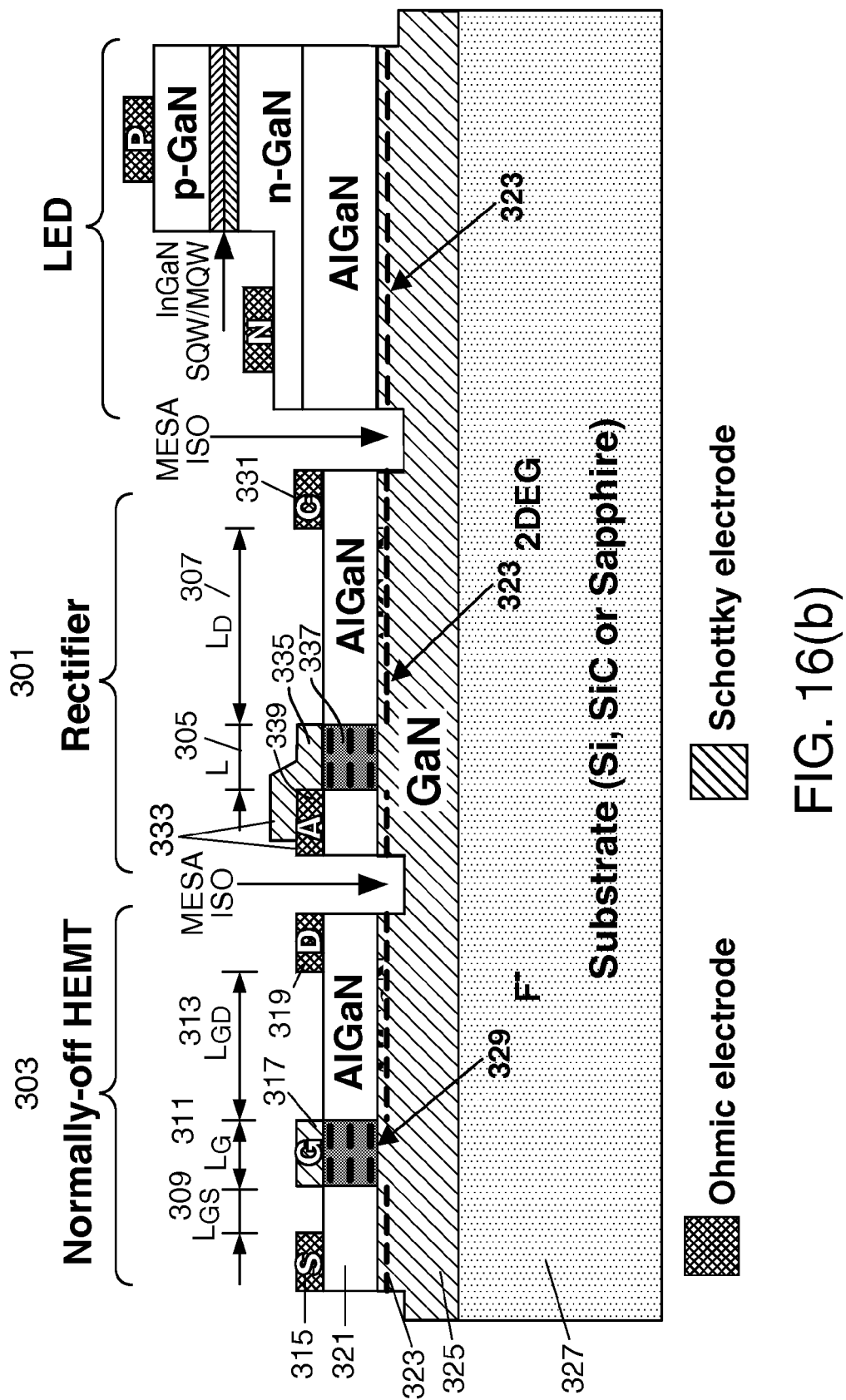
Figure 16C:
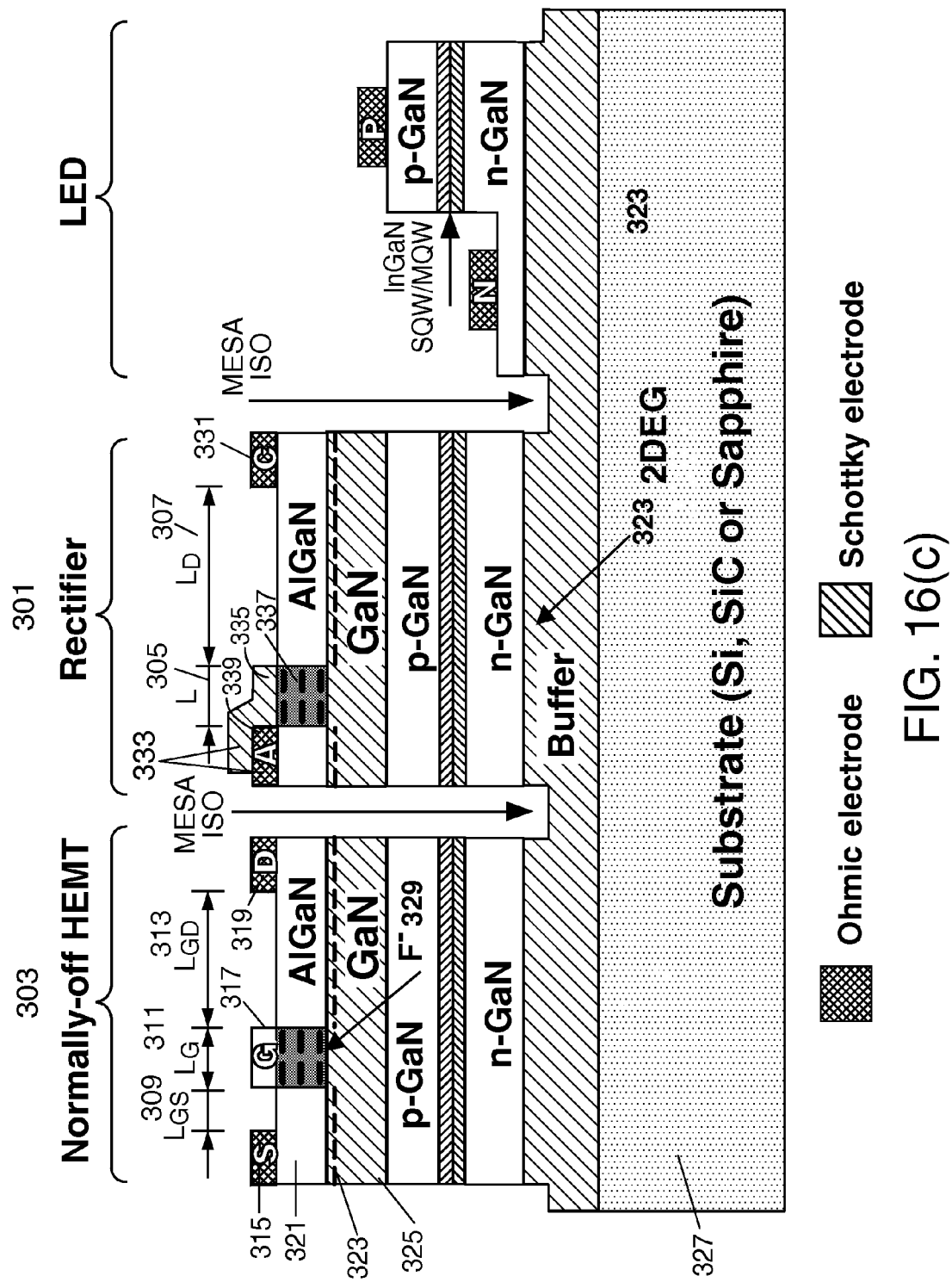

FIGS. 16(a), 16(b), and 16(c) show a further degree of integration, in which light-emitting diode structures are integrated with the other elements mentioned. Each of these Figures includes the elements of FIG. 3, combined with additional optoelectronic device structures.

FIG. 16(a) shows a structure where, starting with a HEMT wafer, the areas for LED fabrication are etched back to expose the GaN layer. This is followed by re-growth of the LED structure, using selective epitaxy. Typically an n-type GaN layer is grown, followed by a pair of narrower-bandgap layers (e.g. InGaN) which provide a quantum well (single or multiple), followed by a p-type GaN layer. During the device fabrication sequence described above, a mesa etch would be used to expose the n-type GaN layer, and ohmic metallization will form the anode and cathode contacts to the light-emitting structure. This process does not integrate as easily as the diode-HEMT combinations described above, but does provide a way to realize even higher integration on a single chip. FIG. 16(b) shows the result of a single growth sequence, in which the heterostructure needed for the HEMT is formed before the heterostructure for the LED. Although this structure looks very similar to that of FIG. 16(a), there is an important problem: the etch which removes the LED layers from HEMT areas must etch into, but not through, the AlGaN layer. Since there is no etch stop within the AlGaN layer, the remaining thickness of the AlGaN layer will have some process variation. This directly results in variation of the HEMTs' threshold voltage, which is very undesirable.

FIG. 16(c) shows a quite different structure, in which a single growth sequence is used, and the LED heterostructure is formed before the HEMT heterostructure. This permits good uniformity in the HEMTs' threshold voltage, while avoiding the difficulties of a patterned epitaxial growth step as in the embodiment of FIG. 16(a). Thus this layered structure, with the HEMT heterostructure formed OVER the LED heterostructure, turns out to be surprisingly advantageous for fabrication of such electronic plus optoelectronic structures.

According to various disclosed embodiments, there is provided: An integrated power device structure, comprising: a merged combination diode which includes a Schottky diode in parallel with a field-controlled diode; and a heterojunction field effect transistor; wherein both said combination diode and said transistor are integrated on a shared layer of a III-N-type semiconductor; and wherein both said combination diode and said transistor include patterned areas where permanent negative charge has been introduced into a wider-bandgap portion of said shared layer which overlies a narrower-bandgap portion of said shared layer.

According to various disclosed embodiments, there is provided: An integrated power device, comprising: a III-N-type semiconductor heterostructure, comprising a barrier layer overlying an active layer thereof, said barrier layer and said active layer having different bandgaps; a first structure region comprising an anode electrode having both an ohmic contact and also a first Schottky barrier contact to said semiconductor structure, and a cathode electrode having an ohmic contact to said semiconductor structure; a second structure region comprising source and drain electrodes making ohmic contact to respective portions of said semiconductor structure, and a gate electrode having a Schottky barrier contact to said semiconductor structure, intermediate between said source and drain electrodes; and respective regions of permanently-trapped charge, located underneath ones of said Schottky barrier contacts in both said first and second structure regions.

According to various disclosed embodiments, there is provided: A switching power converter, comprising: at least one heterojunction field effect transistor, connected to control current through at least one inductor; and a merged combination diode which includes a Schottky diode in parallel with a field-controlled diode, and which is operatively connected to rectify current to at least one terminal of said inductor; wherein both said combination diode and said transistor are integrated on a shared III-N-type semiconductor layer; whereby said switch-mode power converter operates at high frequency with high efficiency.

According to various disclosed embodiments, there is provided: A switching power conversion method, comprising: controlling current through at least one inductor, using at least one heterojunction field effect transistor; and rectifying current to at least one terminal of said inductor, using at least one merged combination diode which includes a Schottky diode in parallel with a field-controlled diode; wherein both said combination diode and said transistor are integrated on a shared III-N-type semiconductor layer; whereby said switch-mode power converter operates at high frequency with high efficiency.

According to various disclosed embodiments, there is provided: a method for manufacturing an integrated semiconductor device, comprising the actions of: forming a III-N-type heterostructure, comprising a barrier layer and an active layer, said barrier layer and said active layer having different bandgaps; forming one or more isolation structures to at least partly separate said heterostructure into first and second structure regions; fabricating a first structure, in said first structure region, which contains: an anode electrode having both an ohmic contact and also a first Schottky barrier contact to said semiconductor structure, a cathode electrode having an ohmic contact to said semiconductor structure, and a first permanently negative charge-trapped region located directly underneath said first Schottky contact; and fabricating a second structure in said second structure region, which contains: source and drain electrodes making ohmic contact to respective portions of sand semiconductor structure, and a gate electrode having a Schottky barrier contact to said semiconductor structure, intermediate between said source and drain electrodes; and a second permanently negative charge-trapped region located directly underneath said second Schottky contact.

According to various disclosed embodiments, there is provided: An integrated device structure, comprising: a first semiconductor heterostructure overlying a second heterostructure, one or more heterojunction field-effect transistors, and one or more merged-diode rectifier structures, all integrated in said first semiconductor heterostructure; and one or more light-emitting diodes formed in said second heterostructure, where said first heterostructure has been at least partially removed.

According to various disclosed embodiments, there is provided: Integrated high efficiency lateral field effect rectifier and HEMT devices of GaN or analogous semiconductor material, methods for manufacturing thereof, and systems which include such integrated devices. The lateral field effect rectifier has an anode containing a shorted ohmic contact and a Schottky contact, and a cathode containing an ohmic contact, while the HEMT preferably has a gate containing a Schottky contact. Two fluorine ion containing regions are formed directly underneath both Schottky contacts in the rectifier and in the HEMT, pinching off the (electron gas) channels in both structures at the hetero-interface between the epitaxial layers.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, minor variations in the semiconductor composition, e.g. use of a phosphonitride instead of a pure nitride, or use of an $AlGa_{(1-x)}N$ over a layer of $Al_yGa_{(1-y)}N$ heterostructure, are also contemplated to be practical alternatives.

Intensive research continues in semiconductor materials, and it is also possible that other semiconductor alloys can take advantage of the structures and processes disclosed in this application. For example, the Group III component of a III-N semiconductor can optionally be replaced by alloys which include some fraction of a Group IIIA element, e.g. Ti.

The present innovations provide users with the capability of making single voltage supply RFIC and MMIC microwave integrated circuits). It also provides users a monolithic integration GaN-based digital integrated circuits that are needed for high temperature electronics.

For example, on the various device structures shown, a variety of materials can optionally be used for the electrodes and contact metals (taking into account any resulting differences in work function). In one contemplated class of embodiments, gate materials with different work functions can be used in combination with the trapped sheet charge layer provided by various embodiments described above. Similarly, various changes or substitutions can be made in the epitaxial layer doping.

Additional structure features may also be added to the basic structures described in this application. For example, various field plates may be added in addition to the contacts.

Additional general background, which helps to show variations and implementations, may be found in the following publications, all of which are hereby incorporated by reference herein for all purposes: N.-Q. Zhang, B. Moran, S. P. Denbaars, U. K. Mishra, X. W. Wang, and T. P. Ma, Phys.Status Solidi A 188, 213 (2001); W. Saito, Y. Takada, M. Kuraguchi, K. Tsuda, I. Omura, T. Ogura, and H. Ohashi, IEEE Trans. Electron Devices 50, 2528 (2003); H. Xing, Y. Dora, A. Chini, S. Heikman, S. Keller, and U. K. Mishra, IEEE Electron Device Lett. 25, 161 (2004); Y. Dora, A. Chakraborty, L. McCarthy, S. Keller, S. P. DenBaars, and U. K. Mishra, IEEE Electron Device Lett. 27, 713 (2006); N. Tipirneni, A. Koudymov, V. Adivarahan, J. Yang, G. Simin, M. Asif Khan, IEEE Electron Device Lett. 27, 716 (2006); Y. Irokawa, B. Luo, Jihyun Kim, J. R. LaRoche, F. Ren, K. H. Baik, S. J. Pearton, C.-C. Pan, G.-T. Chen, J.-I. Chyi, S. S. park and Y. J. Park, Appl. Phys. Lett. 83, 2271 (2003); A. P. Zhang, J. W. Johnson, B. Luo, F. Ren, S. J. Pearton, S. S. Park, Y. J. Park, and J.-I. Chyi, Appl. Phys. Lett. 79, 1555 (2001); Z. Z. Bandic, P. M. Bridger, E. C. Piquette, and T. C. McGill, R. P. Vaudo, V. M. Phanse and J. M. Redwing, Appl. Phys. Lett. 74, 1266 (1999); A. P. Zhang, G. T. Dang, F. Ren, H. Cho, K. Lee, S. J. Pearton, J.-I Chyi, T.-E. Nee, C.-M. Lee, and C.-C. Chuo, IEEE Trans. Electron Devices 48, 407 (2001); J. W. Johason, A. P. Zhang, W.-B. Luo, F. Ren, S. J. Pearton, S. S. Park, Y. J. Park, and J.-I. Chyi, IEEE Trans. Electron Devices 49, 32 (2002); Y. Zhou, D. Wang, C. Ahyi, C.-Che T., J. Williams, M. Park, N. Mark Williams, A. Hanser, Solid-State Electronics 50, 1744 (2006); and J. B. Limb, D. Yoo, J.-H. Ryou, S.-C. Shen, and R. D. Dupuis, IEE Electronics Lett. 43, 67 (2007).

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An integrated power device structure, comprising:
a merged combination diode including a Schottky diode in parallel with a field-controlled diode; and
a heterojunction field effect transistor;
wherein said combination diode and said heterojunction field effect transistor are integrated on a shared layer of a Group III-nitride (III-N-type) semiconductor; and
wherein said combination diode and said heterojunction field effect transistor include patterned areas where permanent negative charge has been introduced into a wider-bandgap portion of said shared layer which overlies a narrower-bandgap portion of said shared layer having a narrower bandgap than the wider-bandgap portion.

2. The structure of claim 1, wherein said permanent negative charge comprises fluorine ions.

3. The structure of claim 1, wherein said wider-bandgap portion is undoped.

4. The structure of claim 1, wherein said wider-bandgap portion comprises Aluminum-Gallium-Nitride (AlGaN).

5. The structure of claim 1, wherein said wider-bandgap portion comprises Aluminum-Gallium-Nitride (AlGaN) capped by Gallium-Nitride (GaN).

6. The structure of claim 1, wherein said narrower-bandgap portion comprises Gallium-Nitride (GaN).

7. The structure of claim 1, wherein said field-controlled diode includes a normally-off channel overlaid by a Schottky contact of the Schottky diode.

8. The structure of claim 1, wherein the heterojunction field effect transistor is an enhancement-mode transistor with a positive threshold voltage.

9. The structure of claim 8, wherein the enhancement-mode transistor is normally-off.

10. An integrated power device, comprising:
a Group III-nitride (III-N-type) semiconductor heterostructure, comprising a barrier layer overlying an active layer thereof, said barrier layer and said active layer having different bandgaps;
a first structure region comprising
an anode electrode having both an ohmic contact and a first Schottky barrier contact to said semiconductor structure, and
a cathode electrode having an ohmic contact to said semiconductor structure;
a second structure region comprising
source and drain electrodes making ohmic contact to respective portions of said semiconductor structure, and
a gate electrode having a Schottky barrier contact to said semiconductor structure, intermediate between said source and drain electrodes; and
respective regions of permanently-trapped charge, located underneath ones of said Schottky barrier contacts in said first and second structure regions.

11. The device of claim 10, wherein said permanently-trapped charge comprises fluorine ions.

12. The device of claim 10, wherein said barrier layer is undoped.

13. The device of claim 10, wherein said barrier layer comprises Aluminum-Gallium-Nitride (AlGaN).

14. The device of claim 10, wherein said barrier layer comprises Aluminum-Gallium-Nitride (AlGaN) capped by Gallium-Nitride (GaN).

15. The device of claim 10, wherein said active layer comprises Gallium-Nitride (GaN).

16. The device of claim 10, wherein said active layer overlies a Group III-nitride (III-N) buffer layer, which overlies a Group III-nitride (III-N) nucleation layer.

17. An integrated power device structure, comprising:
a merged combination diode including a Schottky diode in parallel with a field-controlled diode, wherein the field-controlled diode includes a normally-off channel overlaid by a Schottky contact of the Schottky diode; and
a heterojunction field effect transistor;
wherein the merged combination diode and the heterojunction field effect transistor are integrated on a shared layer of a Group III-nitride (III-N-type) semiconductor; and
wherein the merged combination diode and the heterojunction field effect transistor include patterned areas of a first bandgap portion of the shared layer having a permanent negative charge, and wherein the first bandgap portion overlies a second bandgap portion of said shared layer having a narrower bandgap than the first bandgap portion.

* * * * *